US012796081B2

(12) United States Patent
An et al.

(10) Patent No.: US 12,796,081 B2
(45) Date of Patent: Nov. 10, 2026

(54) DISPLAY DEVICE AND METHOD OF MANUFACTURING THE DISPLAY DEVICE

(71) Applicant: Samsung Display Co., Ltd., Yongin-Si (KR)

(72) Inventors: Jinsung An, Yongin-si (KR); Sungho Kim, Yongin-si (KR); Seokje Seong, Yongin-si (KR); Minwoo Woo, Yongin-si (KR); Seunghyun Lee, Yongin-si (KR); Wangwoo Lee, Yongin-si (KR); Jiseon Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 278 days.

(21) Appl. No.: 17/531,840

(22) Filed: Nov. 22, 2021

(65) Prior Publication Data

US 2022/0336564 A1 Oct. 20, 2022

(30) Foreign Application Priority Data

Apr. 15, 2021 (KR) ........................ 10-2021-0049074

(51) Int. Cl.

*H01L 27/32* (2006.01)
*H10D 86/40* (2025.01)

(Continued)

(52) U.S. Cl.

CPC ....... *H10D 86/423* (2025.01); *H10K 59/1213* (2023.02); *H10K 59/122* (2023.02); *H10K 59/124* (2023.02); *H10K 59/126* (2023.02); *H10K 59/131* (2023.02); *H10K 71/00* (2023.02); *H10D 30/6723* (2025.01); *H10D 30/6731* (2025.01); *H10D 30/6745* (2025.01); *H10D 30/6755* (2025.01); *H10D 86/443* (2025.01);

(Continued)

(58) Field of Classification Search

CPC .... H10K 59/131; H10K 59/65; H10K 59/122; H10K 59/1213; H10K 59/124; H10K 71/00

USPC .......................................................... 257/40

See application file for complete search history.

(56) References Cited

U.S. PATENT DOCUMENTS

| | | | |
|---|---|---|---|
| 8,711,138 | B2 | 4/2014 | Kawabe |
| 9,911,941 | B2 | 3/2018 | Choi et al. |

(Continued)

FOREIGN PATENT DOCUMENTS

| | | | |
|---|---|---|---|
| CN | 111063719 A | 4/2020 | |
| CN | 111180494 A | 5/2020 | |

(Continued)

*Primary Examiner* — Dzung Tran

(74) *Attorney, Agent, or Firm* — Innovation Counsel LLP

(57) ABSTRACT

A display device includes: a substrate; an inorganic insulating layer arranged on the substrate; a plurality of display elements arranged on the organic insulating layer and including a plurality of first display elements and a plurality of second display elements; a lower line arranged between the substrate and the organic insulating layer, and electrically connecting one of the plurality of first display elements and another one of the plurality of first display elements to each other; and an upper line arranged on the organic insulating layer, and electrically connecting one of the plurality of second display elements and the other one of the plurality of second display elements to each other.

12 Claims, 21 Drawing Sheets

(51) Int. Cl.

| | |
|---|---|
| ***H10K 59/121*** | (2023.01) |
| ***H10K 59/122*** | (2023.01) |
| ***H10K 59/124*** | (2023.01) |
| ***H10K 59/126*** | (2023.01) |
| ***H10K 59/131*** | (2023.01) |
| ***H10K 71/00*** | (2023.01) |
| *H10D 30/67* | (2025.01) |
| *H10D 86/60* | (2025.01) |
| *H10K 59/12* | (2023.01) |
| *H10K 59/65* | (2023.01) |

(52) U.S. Cl.
CPC ......... *H10D 86/451* (2025.01); *H10D 86/471* (2025.01); *H10D 86/60* (2025.01); *H10K 59/1201* (2023.02); *H10K 59/65* (2023.02)

(56) References Cited

U.S. PATENT DOCUMENTS

| | | | | |
|---|---|---|---|---|
| 11,404,512 | B2 | 8/2022 | Kim et al. | |
| 11,424,312 | B2 | 8/2022 | Baek et al. | |
| 2016/0275910 | A1* | 9/2016 | Lee | G09G 3/3225 |
| 2016/0322595 | A1 | 11/2016 | Choi et al. | |
| 2017/0338252 | A1* | 11/2017 | Lee | H10D 86/481 |
| 2018/0033805 | A1* | 2/2018 | Gupta | H01L 27/1255 |
| 2018/0089485 | A1* | 3/2018 | Bok | G06F 1/1684 |
| 2018/0366586 | A1* | 12/2018 | Son | H01L 27/1218 |
| 2019/0288048 | A1 | 9/2019 | Kang et al. | |
| 2019/0305065 | A1* | 10/2019 | Kim | H01L 27/1255 |
| 2020/0312941 | A1* | 10/2020 | Na | H10K 59/131 |
| 2020/0373369 | A1* | 11/2020 | Kang | H10K 77/111 |

FOREIGN PATENT DOCUMENTS

| | | | |
|---|---|---|---|
| CN | 111653201 | A | 9/2020 |
| KR | 10-2007-0072207 | A | 7/2007 |
| KR | 10-1476433 | B1 | 12/2014 |
| KR | 10-2016-0009772 | A | 1/2016 |
| KR | 10-2016-0130042 | A | 11/2016 |
| KR | 10-2017-0024604 | A | 3/2017 |
| KR | 10-2019-0108220 | A | 9/2019 |
| KR | 10-2035004 | B1 | 10/2019 |
| KR | 1020200097371 | A | 8/2020 |
| KR | 1020210035358 | A | 4/2021 |

* cited by examiner

DISPLAY DEVICE AND METHOD OF MANUFACTURING THE DISPLAY DEVICE

CROSS-REFERENCE TO RELATED APPLICATION

This application is based on and claims priority under 35 U.S.C. § 119 to Korean Patent Application No. 10-2021-0049074, filed on Apr. 15, 2021, in the Korean Intellectual Property Office, the disclosure of which is incorporated by reference herein in its entirety.

BACKGROUND

1. Field

One or more embodiments relate to a display device and a method of manufacturing the display device.

2. Description of the Related Art

Recently, as display devices have become thinner and more lightweight, the usage of display devices has diversified and expanded.

As the area occupied by an image-displaying area in display devices has expanded, various functions associated with or linked to display devices have been added. To add various functions, display devices having an area for performing various functions while displaying an image have been continuously studied.

An area for performing various functions while displaying an image needs to maintain high transmittance of light or sound to perform the functions. Meanwhile, when high transmittance is maintained in the area for performing the various functions while displaying an image, the resolution of the area may decrease.

SUMMARY

One or more embodiments include a display device that is capable of maintaining a high resolution while maintaining high transmittance.

In addition, one or more embodiments include a method of manufacturing a display device, in which a manufacturing process of the display device is simplified, and the manufactured display device sustains a high reliability.

Additional aspects will be set forth in part in the description which follows and, in part, will be apparent from the description, or may be learned by practice of the presented embodiments of the disclosure.

According to an embodiment, a display device includes a substrate, an organic insulating layer arranged on the substrate, a plurality of display elements arranged on the organic insulating layer and including a plurality of first display elements and a plurality of second display elements, a lower line arranged between the substrate and the organic insulating layer, and electrically connecting one of the plurality of first display elements and another one of the plurality of first display elements to each other, and an upper line arranged on the organic insulating layer, and electrically connecting one of the plurality of second display elements and another one of the plurality of second display elements to each other.

The lower line and the upper line may cross each other in a plan view.

The display device may further include a first thin-film transistor arranged on the substrate, and including a first semiconductor layer, and a first gate electrode overlapping the first semiconductor layer, the first semiconductor layer including a silicon semiconductor, a first inorganic insulating layer covering the first gate electrode, a second thin-film transistor arranged on the first inorganic insulating layer, and including a second semiconductor layer, and a second gate electrode overlapping the second semiconductor layer, the second semiconductor layer including an oxide semiconductor, and a second inorganic insulating layer arranged between the second semiconductor layer and the second gate electrode, wherein the lower line is arranged between the first inorganic insulating layer and the second inorganic insulating layer.

The display device may further include an intermediate conductive pattern arranged between the lower line and the second inorganic insulating layer, and the second inorganic insulating layer may include a contact hole overlapping the intermediate conductive pattern.

The intermediate conductive pattern and the second semiconductor layer may include the same material.

The plurality of display elements may include a plurality of pixel electrodes, the display device may further include a pixel-defining layer covering the upper line, the pixel defining layer including a plurality of openings overlapping the plurality of pixel electrodes, and one of the plurality of pixel electrodes may at least partially cover one side of the upper line, and another one of the plurality of pixel electrodes may at least partially cover another side of the upper line.

The plurality of display elements may constitute a first sub-pixel, a second sub-pixel, and a third sub-pixel, which emit light of different wavelengths from each other, the second sub-pixel may be arranged at a center of a virtual quadrilateral, the first sub-pixel and the third sub-pixel may be arranged at vertices of the virtual quadrilateral, respectively, and the one of the plurality of first display elements and the other one of the plurality of first display elements may constitute one of the first sub-pixel, the second sub-pixel, and the third sub-pixel, respectively.

The display device may further include a pixel circuit electrically connected to the plurality of display elements, wherein the substrate includes a first area, and a second area arranged adjacent to the first area, the plurality of display elements are arranged in the first area and the second area, and the pixel circuit is arranged in the second area.

The display device may further include a connection line arranged on a same layer as one of the lower line and the upper line, wherein the plurality of first display elements and the plurality of second display elements are arranged in the first area, and the connection line includes a transparent conductive material and extends to the second area from the first area.

The display device may further include a component overlapping the first area.

According to an embodiment, a method of manufacturing a display device includes preparing a display substrate including a substrate, a first semiconductor layer including silicon arranged on the substrate, a first gate electrode overlapping the first semiconductor layer, and a first inorganic insulating layer covering the first gate electrode, forming a lower conductive layer on the first inorganic insulating layer, forming a second semiconductor layer on the first inorganic insulating layer, and forming an intermediate conductive pattern on the lower conductive layer, forming an organic insulating layer on the second semiconductor layer and the intermediate conductive pattern, forming an upper conductive layer on the organic insulating layer, and forming a pixel electrode at least partially covering the upper conductive layer.

The pixel electrode may be formed after the upper conductive layer is formed.

The forming of the lower conductive layer may include forming a first layer on the first inorganic insulating layer, the first layer including a conductive material, patterning the first layer, and curing the first layer.

The forming of the second semiconductor on the first inorganic insulating layer and forming of the intermediate conductive pattern on the lower conductive layer may include forming a second layer on the first inorganic insulating layer and the lower conductive layer, the second layer including an oxide semiconductor, and patterning the second layer.

The second semiconductor layer and the intermediate conductive pattern may include the same material.

The method may further include forming a second inorganic insulating layer on the second semiconductor layer and the intermediate conductive pattern, and forming a contact hole in the second inorganic insulating layer, the contact hole exposing the intermediate conductive pattern.

The method may further include forming a pixel-defining layer covering the pixel electrode and the upper conductive layer, the pixel-defining layer including an opening overlapping the pixel electrode.

The pixel electrode is provided in plurality, and the upper conductive layer may electrically connect one of the plurality of pixel electrodes and another one of the plurality of pixel electrodes.

The substrate may include a first area and a second area arranged adjacent to the first area, the pixel electrode may be arranged in any one of the first area and the second area, and the first semiconductor layer and the second semiconductor layer may be arranged in the second area.

The pixel electrode may be arranged in the first area, and at least one of the lower conductive layer and the upper conductive layer may include a connection line extending to the second area from the first area.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION

Figure 1:
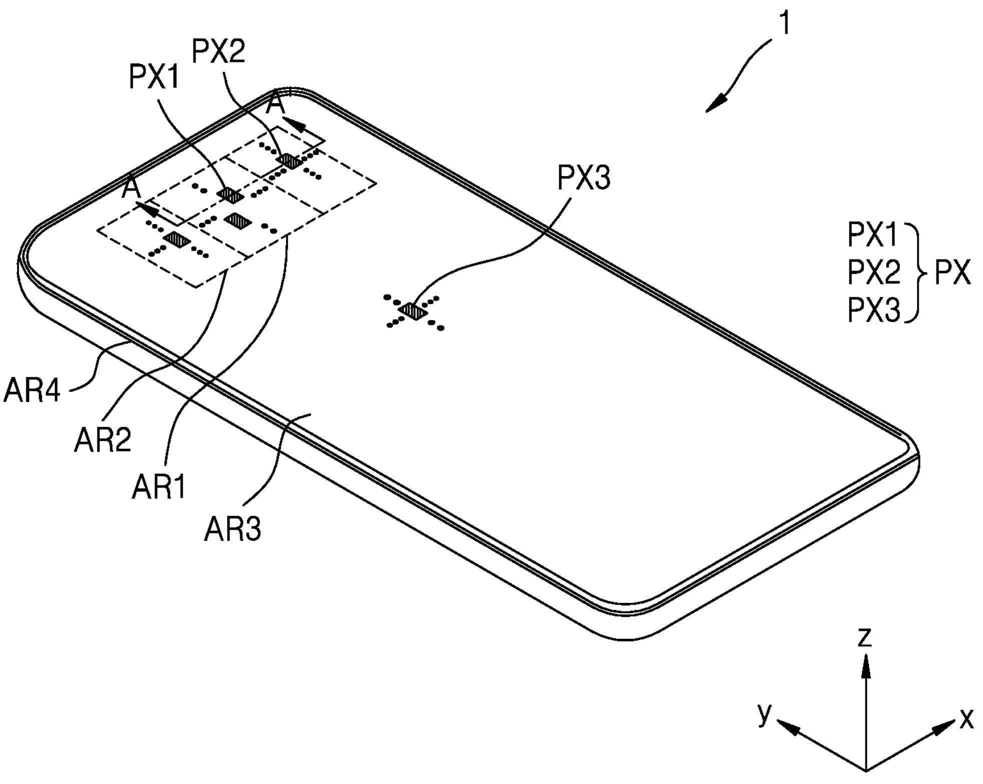
FIG. 1 is a perspective view schematically illustrating a display device according to an embodiment.

Reference will now be made in detail to embodiments, examples of which are illustrated in the accompanying drawings, wherein like reference numerals refer to like elements throughout the present disclosure. In this regard, the present embodiments may have different forms and configuration and should not be construed as being limited to the descriptions set forth herein. Accordingly, the embodiments are merely described below, by referring to the figures, to explain aspects of the present disclosure. As used herein, the term "and/or" includes any and all combinations of one or more of the associated listed items. Throughout the present disclosure, the expression "at least one of a, b or c" indicates only a, only b, only c, both a and b, both a and c, both b and c, all of a, b, and c, or any variations thereof.

Because the present disclosure may have diverse modified embodiments, embodiments are illustrated in the drawings and are described with respect to the embodiments. An effect and a characteristic of the present disclosure, and a method of accomplishing them will be apparent by referring to embodiments described with reference to the drawings. The present disclosure may, however, be embodied in many different forms and configurations and should not be construed as limited to the embodiments set forth herein.

One or more embodiments of the present disclosure will be described below in more detail with reference to the accompanying drawings. Components that are the same or are in correspondence with each other are rendered the same reference numeral regardless of the figure number, and redundant explanations are omitted.

While such terms as "first," "second," etc., may be used to describe various components, such components are not to be limited to the above terms. The above terms are used only to distinguish one component from another component.

An expression used in the singular encompasses an expression of the plural unless the context expressly indicates otherwise.

It will be understood that the terms "comprises" and/or "comprising" used herein specify the presence of stated features or elements, but do not preclude the presence or addition of one or more other features or elements.

It will be further understood that when a layer, area, or element is referred to as being "formed on" another layer, area, or element, it can be directly or indirectly formed on the other layer, region, or element. That is, for example, one or more intervening layers, areas, or elements may be present therebetween.

When an embodiment may be implemented differently, a certain process order may be performed differently from the described order. For example, two consecutively described processes may be performed substantially at the same time or performed in an order opposite to the described order.

It will be understood that when a layer, region, or component is referred to as being connected to another layer, region, or component, it can be directly or indirectly connected to the other layer, region, or component. That is, for example, intervening layers, regions, or components may be present. For example, when layers, areas, or elements or the like are referred to as being "electrically connected," they may be directly electrically connected, or layers, areas or elements may be indirectly electrically connected, and an intervening layer, region, component, or the like may be present therebetween.

FIG. 1 is a perspective view schematically illustrating a display device 1 according to an embodiment.

Referring to FIG. 1, the display device 1 may display an image. The display device 1 may include a pixel PX. The pixel PX may be defined as an area in which a display element emits light. In an embodiment, the pixel PX may include a plurality of sub-pixels. In an embodiment, the plurality of sub-pixels may include a first sub-pixel, a second sub-pixel, and a third sub-pixel. The first sub-pixel, the second sub-pixel, and the third sub-pixel may emit light of different wavelengths from each other. In an embodiment, a plurality of pixels PX may be provided in the display device 1. The plurality of pixels PX may each emit light and display an image. In an embodiment, the pixel PX may include a first pixel PX1, a second pixel PX2, and a third pixel PX3.

The display device 1 may include a first area AR1, a second area AR2, a third area AR3, and a fourth area AR4. The first area AR1, the second area AR2, and the third area AR3 may have the pixel PX arranged therein, and may be a display area. The fourth area AR4 may not have the pixel PX arranged therein, and may be a non-display area.

At least one of the first area AR1 and the second area AR2 may include an area overlapping a component and an area in which the pixel PX is arranged. For example, the first area AR1 may include an area overlapping the component and an area in which the pixel PX is arranged. In another example, each of the first area AR1 and the second area AR2 may include an area overlapping the component and an area in which the pixel PX is arranged. In an embodiment, the first pixel PX1 may be arranged in the first area AR1. The second pixel PX2 may be arranged in the second area AR2. Thus, the first area AR1 and the second area AR2 may include an area for displaying an image and an area in which the component is arranged.

At least one of the first area AR1 and the second area AR2 may overlap the component. Thus, the display device 1 may have high transmittance of light or sound in the first area AR1 and the second area AR2. For example, in at least one of the first area AR1 and the second area AR2, the light transmittance of the display device 1 may be about 10% or more, for example, about 25% or more, about 40% or more, about 50% or more, about 85% or more, or about 90% or more. In an embodiment, light transmittance of the display device 1 in the first area AR1 may be greater than that of the display device 1 in the second area AR2.

In an embodiment, the display device 1 may include at least one first area AR1. For example, the display device 1 may have one or more first areas AR1.

The second area AR2 may be arranged adjacent to the first area AR1. For example, the first area AR1 and the second area AR2 may be arranged side by side in a first direction (for example, an x direction or a −x direction). In another example, the first area AR1 and the second area AR2 may be arranged side by side in a second direction (for example, a y direction or a −y direction). In an embodiment, the second area AR2 may be arranged at opposite sides of the first area AR1.

In an embodiment, it is shown that the first area AR1 and the second area AR2 are arranged at an upper side of the display device 1, but in another embodiment, the first area AR1 and the second area AR2 may be arranged at a lower, right, or left side of the display device 1.

In an embodiment, at least one of the first area AR1 and the second area AR2 may have various shapes such as a circular shape, an oval shape, a polygonal shape such as a quadrilateral, a star shape, or a diamond shape, in a plan view (for example, an x-y plane). In FIG. 1, each of the first area AR1 and the second area AR2 has a quadrilateral shape.

The third area AR3 may at least partially surround the first area AR1 and the second area AR2. In an embodiment, the third area AR3 may surround the entire first area AR1 and the entire second area AR2. In another embodiment, the third area AR3 may surround only a portion of the first area AR1 and a portion of the second area AR2. The third pixel PX3 may be arranged in the third area AR3. In an embodiment, the third area AR3 may include a display area. In an embodiment, a resolution of the display device 1 in the third area AR3 may be greater than or equal to that of the display device 1 in the first area AR1.

The fourth area AR4 may at least partially surround the third area AR3. In an embodiment, the fourth area AR4 may surround the entire third area AR3. The pixel PX may not be arranged in the fourth area AR4. In an embodiment, the fourth area AR4 may include a non-display area.

Figure 2:
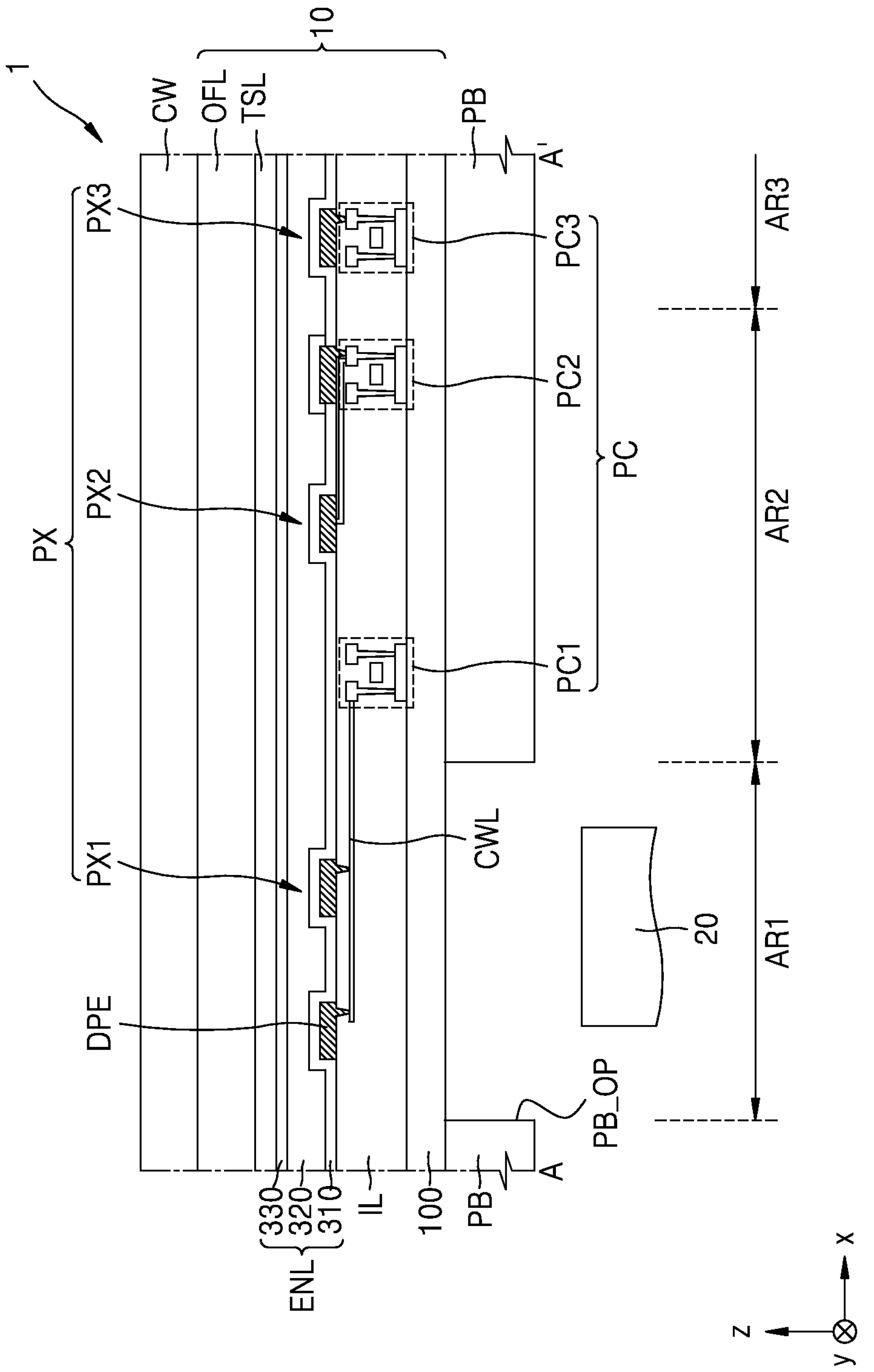
FIG. 2 is a cross-sectional view schematically illustrating the display device in FIG. 1, taken along line A-A'.

FIG. 2 is a cross-sectional view schematically illustrating the display device 1 in FIG. 1, taken along a line A-A'.

Referring to FIG. 2, the display device 1 may include a display panel 10, a panel protection layer PB, a component 20, and a cover window CW. The display panel 10 may include a substrate 100, an insulating layer IL, a pixel circuit PC, a display element DPE, an encapsulation layer ENL, a touch sensor layer TSL, and an optical functional layer OFL.

The display device 1 may include the first area AR1, the second area AR2, and the third area AR3. In other words, the first area AR1, the second area AR2, and the third area AR3 may be defined in the substrate 100 and multiple layers on the substrate 100. For example, the first area AR1, the second area AR2, and the third area AR3 may be defined in the substrate 100. In other words, the substrate 100 may include the first area AR1, the second area AR2, and the third area AR3. Herein below, a case where the substrate 100 includes the first area AR1, the second area AR2, and the third area AR3 will be described in detail.

The substrate 100 may include an insulating material, such as glass, quartz, a polymer resin, or the like. The substrate 100 may include a rigid substrate, or a flexible substrate that is bendable, foldable, or rollable.

The insulating layer IL and the pixel circuit PC may be arranged on the substrate 100. The insulating layer IL may insulate elements of the display panel 10. The insulating layer IL may include at least one of an organic material and an inorganic material. The pixel circuit PC may be electrically connected to the display element DPE and drive the display element DPE. The pixel circuit PC may be insulated by the insulating layer IL. In an embodiment, the pixel circuit PC may include a first pixel circuit PC1, a second pixel circuit PC2, and a third pixel circuit PC3. The first pixel circuit PC1 and the second pixel circuit PC2 may be arranged in the second area AR2. The third pixel circuit PC3 may be arranged in the third area AR3. In an embodiment, the pixel circuit PC may not be arranged in the first area AR1. Thus, transmittance (for example, light transmittance) of the display panel 10 in the first area AR1 may be relatively greater than that of the display panel 10 in the second area AR2 and the third area AR3.

The display element DPE may be arranged on the insulating layer IL. In an embodiment, the display element DPE may include an organic light-emitting diode including an emission layer. In some embodiments, the display element DPE may include a light-emitting diode (LED). A size of the LED may be on a microscale or a nanoscale. For example, the LED may include a micro LED. In some embodiments, the LED may include a nanorod LED. The nanorod LED may include gallium nitride (GaN). In an embodiment, a color conversion layer may be arranged on the nanorod LED. The color conversion layer may include a quantum dot. In some embodiments, the display element DPE may include a quantum dot light-emitting diode including a quantum dot emission layer. In some embodiments, the display element DPE may include an inorganic LED including an inorganic semiconductor. Herein below, a case where the display element DPE is an organic light-emitting diode will be described in detail.

The display panel 10 may include a plurality of display elements DPE. The plurality of display elements DPE may be arranged in the first area AR1, the second area AR2, and the third area AR3. In an embodiment, the display element DPE may emit light and constitute the pixel PX. For example, the display elements DPE arranged in the first area AR1 may emit light and constitute the first pixel PX1. The display element DPE arranged in the second area AR2 may emit light and constitute the second pixels PX2. The display elements DPE arranged in the third area AR3 may emit light and constitute the third pixels PX3. Thus, the display device 1 may display an image in the first area AR1, the second area AR2, and the third area AR3.

In an embodiment, the plurality of display elements DPE may be electrically connected to one first pixel circuit PC1. Thus, the plurality of display elements DPE may emit light using a small number of first pixel circuits PC1, and the number of first pixel circuits may be reduced.

The display elements DPE arranged in the first area AR1 may be electrically connected to the first pixel circuit PC1 through a connection line CWL. The connection line CWL may extend to the first area AR1 from the second area AR2. Thus, the connection line CWL may overlap the first area AR1 and the second area AR2.

The connection line CWL may include a transparent conductive material. For example, the connection line CWL may include a transparent conducting oxide (TCO). The connection line CWL may include a conductive oxide, such as indium tin oxide (ITO), indium zinc oxide (IZO), zinc oxide (ZnO), indium oxide ($In_2O_3$), indium gallium oxide (IGO), or aluminum zinc oxide (AZO).

The plurality of display elements DPE arranged in the second area AR2 may be electrically connected to one second pixel circuit PC2. Thus, the plurality of display elements DPE arranged in the second area AR2 may emit light using a small number of second pixel circuits PC2, and the number of second pixel circuits PC2 may be reduced.

The encapsulation layer ENL may cover the display element DPE. In an embodiment, the encapsulation layer ENL may include at least one inorganic encapsulation layer and at least one organic encapsulation layer. The at least one inorganic encapsulation layer may include one or more inorganic materials from among $Al_2O_3$, titanium oxide ($TiO_2$), tantalum oxide ($Ta_2O_5$), ZnO, silicon oxide ($SiO_2$), silicon nitride ($SiN_X$), and silicon oxynitride (SiON). The at least one organic encapsulation layer may include a polymer-based material. The polymer-based material may include an acryl-based resin, an epoxy-based resin, polyimide, and polyethylene. In an embodiment, the at least one organic encapsulation layer may include an acrylate.

In an embodiment, the encapsulation layer ENL may include a first inorganic encapsulation layer 310, an organic encapsulation layer 320, and a second inorganic encapsulation layer 330, which are sequentially stacked. The first inorganic encapsulation layer 310 and the second inorganic encapsulation layer 330 may prevent or reduce exposure of the organic encapsulation layer 320 and/or the display element DPE to foreign materials such as moisture.

In another embodiment, the encapsulation layer ENL may have a structure in which the substrate 100 and an upper substrate, which is a transparent layer, are coupled to each other using an encapsulation layer so that an inner space between the substrate 100 and the upper substrate is sealed. In this case, a moisture absorbent or a filler may be disposed in the inner space. The encapsulation layer may include a sealant, and in another embodiment, may include a material cured by laser. For example, the encapsulation layer may include frit. For example, the encapsulation layer may include a urethane-based resin, an epoxy-based resin, and an acryl-based resin as organic sealants, or may include silicon as an inorganic sealant. For example, the urethane-based resin may include urethane acrylate. The acryl-based resin may include, for example, butyl acrylate, ethylhexyl acrylate, etc. Meanwhile, the encapsulation layer may include a material cured by heat.

The touch sensor layer TSL may obtain coordinate information according to an external input, for example, a touch event. The touch sensor layer TSL may include a touch electrode and touch lines connected to the touch electrode. The touch sensor layer TSL may detect an external input by using a self-capacitance method or a mutual capacitance method.

The touch sensor layer TSL may be arranged on the encapsulation layer ENL. In an embodiment, the touch sensor layer TSL may be directly arranged on the encapsulation layer ENL. In this case, an adhesive layer, such as an optical clear adhesive, may not be arranged between the touch sensor layer TSL and the encapsulation layer ENL. In another embodiment, the touch sensor layer TSL may be separately prepared, and then coupled onto the encapsulation layer ENL using an adhesive layer such as the optical clear adhesive.

The optical functional layer OFL may include an anti-reflection layer. The anti-reflection layer may reduce reflectivity of (external) light incident toward the display device 1 from the outside. In some embodiments, the optical functional layer OFL may include a polarizing film. In some embodiments, the optical functional layer OFL may include a filter plate including a black matrix and color filters.

The cover window CW may be arranged on the display panel 10. The cover window CW may protect the display panel 10. The cover window CW may include at least one of glass, sapphire, and plastic. For example, the cover window CW may include ultra thin glass (UTG) and colorless polyimide (CPI).

The panel protection layer PB may be arranged below the substrate 100. The panel protection layer PB may support and protect the substrate 100. In an embodiment, the panel protection layer PB may include an opening PB_OP overlapping the first area AR1. In another embodiment, the opening PB_OP of the panel protection layer PB may overlap the first area AR1 and the second area AR2. In an embodiment, the panel protection layer PB may include polyethylene terephthalate or polyimide.

The component 20 may be arranged below the display panel 10. In an embodiment, the component 20 may be arranged below the cover window CW with the display panel 10 disposed therebetween. In an embodiment, the component 20 may overlap the first area AR1. In an embodiment, the component 20 may overlap the first area AR1 and the second area AR2.

The component 20 is a camera using infrared or visible light and may include an image pickup device. In some embodiments, the component 20 may include a solar cell, a flash, an illuminance sensor, a proximity sensor, and an iris sensor. In some embodiments, the component 20 may have a function of receiving sound. To minimize the limitation of the function of the component 20, the first pixel circuit PC1 for driving the display element DPE arranged in the first area AR1 may not be arranged in the first area AR1, but may be arranged in the second area AR2. Thus, a transmittance of the display panel 10 in the first area AR1 may be greater than a light transmittance of the display panel 10 in the second area AR2.

Figure 3:
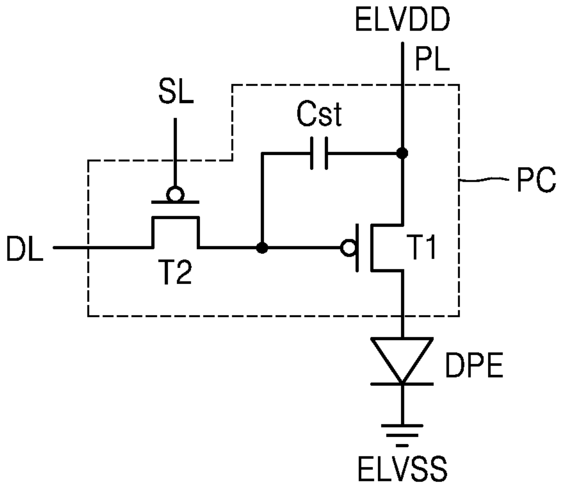
FIG. 3 is an equivalent circuit diagram schematically illustrating a pixel circuit electrically connected to a display element, according to an embodiment.

FIG. 3 is an equivalent circuit diagram schematically illustrating the pixel circuit PC electrically connected to the display element DPE according to an embodiment.

Referring to FIG. 3, the pixel circuit PC may include a driving thin-film transistor T1, a switching thin-film transistor T2, and a storage capacitor Cst.

The switching thin-film transistor T2 is electrically connected to a scan line SL and a data line DL, and may transfer a data signal or a data voltage received from the data line DL to the driving thin-film transistor T1 in response to the scan signal received from the scan line SL. The storage capacitor Cst is electrically connected between the switching thin-film transistor T2 and a driving voltage line PL, and may store a voltage corresponding to a voltage difference between a voltage received from the switching thin-film transistor T2 and a driving voltage ELVDD applied to the driving voltage line PL.

The driving thin-film transistor T1 is connected between the driving voltage line PL and the display element DPE, and may control a driving current flowing to the display element DPE from the driving voltage line PL according to the voltage stored in the storage capacitor Cst. The display element DPE may emit light having a luminance by the driving current. An opposite electrode of the display element DPE may receive a common voltage ELVSS.

In FIG. 3, the pixel circuit PC includes two thin-film transistors and one storage capacitor, but the pixel circuit PC may include three or more thin-film transistors.

Figure 4:
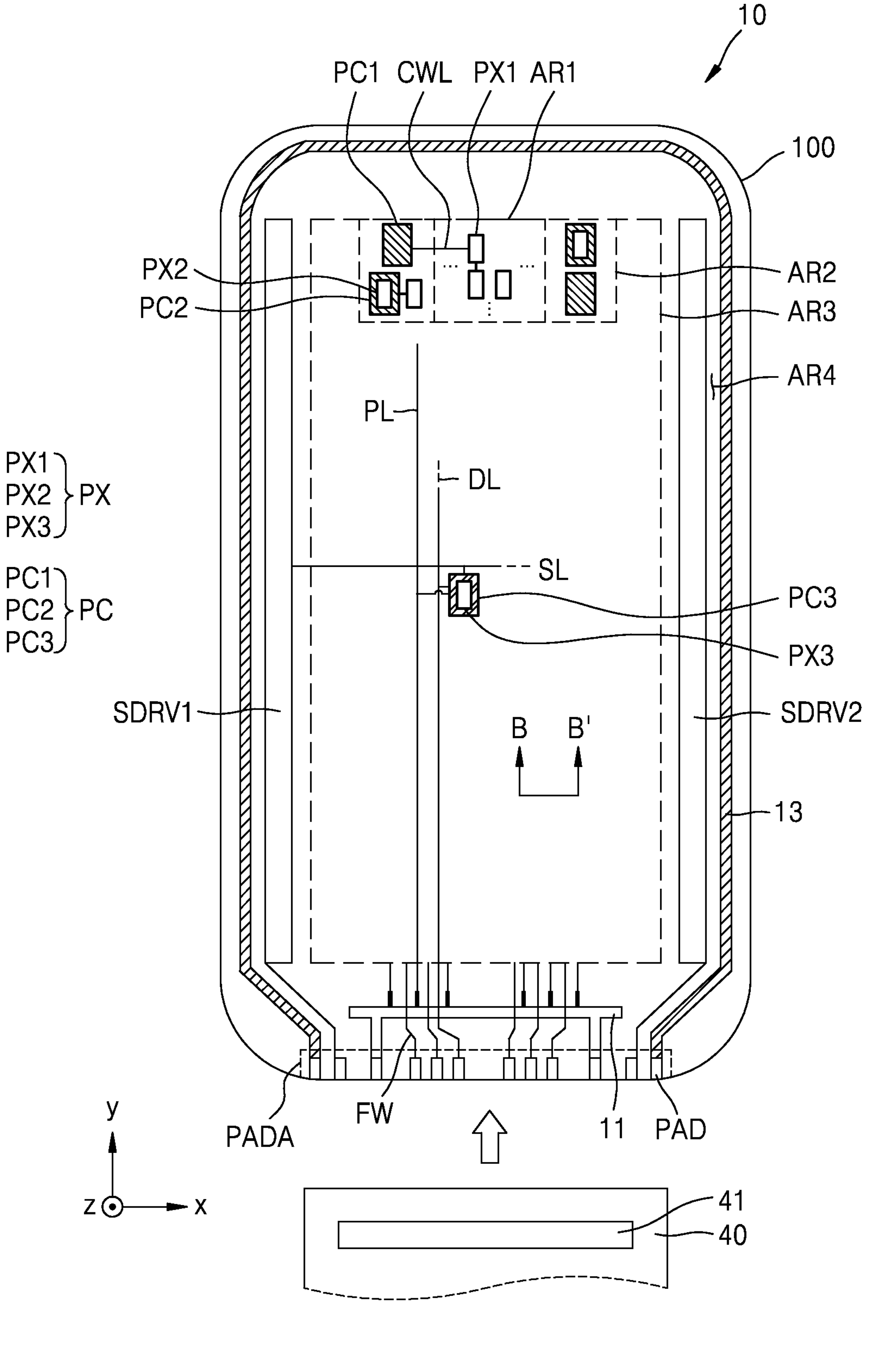
FIG. 4 is a plan view schematically illustrating a display panel according to an embodiment.

FIG. 4 is a plan view schematically illustrating a display panel 10 according to an embodiment. In FIG. 4, the same reference numerals as those of FIG. 1 denote the same elements, and redundant descriptions will be omitted.

Referring to FIG. 4, the display panel 10 may include the substrate 100, the pixel circuit PC, and the pixel PX. In an embodiment, the substrate 100 may include the first area AR1, the second area AR2, the third area AR3, and the fourth area AR4. The second area AR2 may be arranged adjacent to the first area AR1. The third area AR3 may at least partially surround the first area AR1 and the second area AR2. The fourth area AR4 may at least partially surround the third area AR3.

The pixel circuit PC may include a first pixel circuit PC1, a second pixel circuit PC2, and a third pixel circuit PC3. In an embodiment, the first pixel circuit PC1 and the second pixel circuit PC2 may be arranged in the second area AR2. The third pixel circuit PC3 may be arranged in the third area AR3. In an embodiment, the pixel circuit PC may not be arranged in the first area AR1.

The pixel PX may be implemented as a display element, such as an organic light-emitting diode. The pixel PX may include the first pixel PX1, the second pixel PX2, and the third pixel PX3. The first pixel PX1 may be arranged in the first area AR1. The first pixel PX1 may be electrically connected to the first pixel circuit PC1 disposed in the second area AR2. In an embodiment, the first pixel PX1 may be electrically connected to the first pixel circuit PC1 through a connection line CWL. In an embodiment, one of the plurality of first pixels PX1 may be electrically connected to the other one of the plurality of first pixels PX1. In this case, the one of the plurality of first pixels PX1 and the other one of the plurality of first pixels PX1 may be connected to one first pixel circuit PC1 and may emit light in the same manner.

The second pixel PX2 may be arranged in the second area AR2. The second pixel PX2 may be electrically connected to the second pixel circuit PC2 disposed in the second area AR2. The second pixel PX2 may overlap the second pixel circuit PC2. In an embodiment, one of the plurality of second pixels PX2 may be electrically connected to the other one of the plurality of second pixels PX2. In this case, the one of the plurality of second pixels PX2 and the other one of the plurality of second pixels PX2 may be connected to one second pixel circuit PC2 and may emit light in the same manner.

The third pixel PX3 may be arranged in the third area AR3. The third pixel PX3 may be electrically connected to the third pixel circuit PC3. The third pixel PX3 may overlap the third pixel circuit PC3.

A plurality of pixels PX may be provided and the plurality of pixels PX may emit light and display an image. In an embodiment, each of the first pixel PX1, the second pixel PX2, and the third pixel PX3 may be provided in plurality. The plurality of first pixels PX1, the plurality of second pixels PX2, and the plurality of third pixels PX3 may display one image or may each display images that are independent from each other.

In an embodiment, a resolution of the display panel 10 in the first area AR1 and/or the second area AR2 may be less than or equal to that of the display panel 10 in the third area AR3. For example, the resolution of the display panel 10 in the first area AR1 and/or the second area AR2 may be about $\frac{1}{2}$, $\frac{3}{8}$, $\frac{1}{3}$, $\frac{1}{4}$, $\frac{2}{9}$, $\frac{1}{8}$, $\frac{1}{9}$, or $\frac{1}{16}$ that of the display panel 10 in the third area AR3.

The fourth area AR4 may include a non-display area in which no pixels PX are arranged. A first scan driving circuit SDRV1, a second scan driving circuit SDRV2, a pad PAD, a driving voltage supply line 11, and a common voltage supply line 13 may be arranged in the fourth area AR4.

One of the first scan driving circuit SDRV1 and the second scan driving circuit SDRV2 may transmit a scan signal to the pixel circuit PC through a scan line SL. In an embodiment, the first scan driving circuit SDRV1 and the second scan driving circuit SDRV2 may be disposed on opposite sides of the substrate 100 with the third area AR3 disposed therebetween. In an embodiment, one of the plurality of pixels PX may receive a scan signal from the first scan driving circuit SDRV1 and the other one of the plurality of pixels PX may receive a scan signal from the second scan driving circuit SDRV2.

The pad PAD may be arranged in a pad area PADA disposed at one side of the fourth area AR4. The pad PAD may be exposed through an opening formed in an insulating layer, and may be connected to a display circuit board 40 through the opening. A display driver 41 may be arranged in the display circuit board 40.

The display driver 41 may generate a signal to be transmitted to the first scan driving circuit SDRV1 and the second scan driving circuit SDRV2. The display driver 41 generates a data signal, and the generated data signal may be transmitted to the pixel circuit PC through a fan-out wire FW and a data line DL connected to the fan-out wire FW.

The display driver 41 may apply the driving voltage ELVDD (see FIG. 3) to the driving voltage supply line 11, and may apply the common voltage ELVSS (see FIG. 3) to the common voltage supply line 13. The driving voltage ELVDD may be applied to the pixel circuit PC through a driving voltage line PL connected to the driving voltage supply line 11, and the common voltage ELVSS may be applied to an opposite electrode of a display element connected to the common voltage supply line 13.

Figure 5:
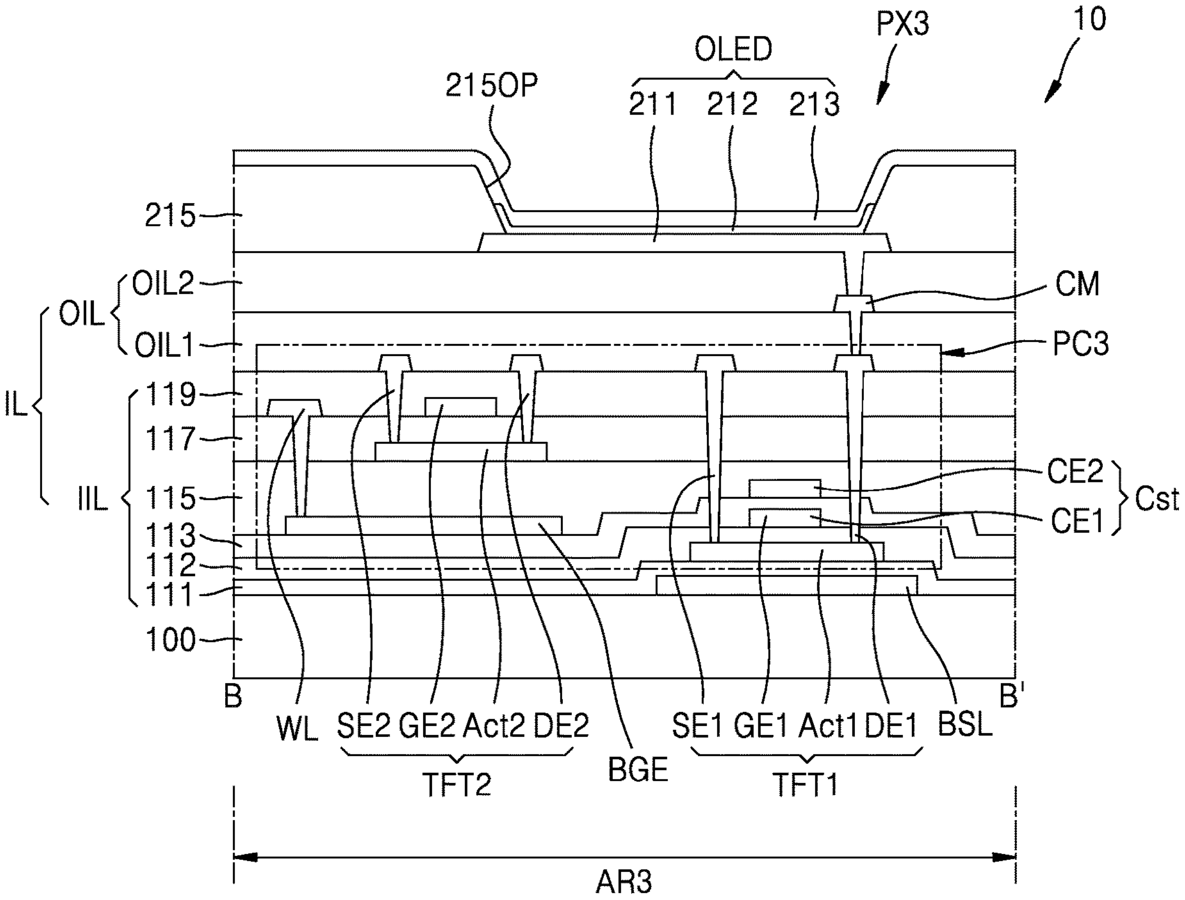
FIG. 5 is a cross-sectional view of the display panel in FIG. 4, taken along line B-B'.

FIG. 5 is a cross-sectional view of the display panel 10 in FIG. 4, taken along a line B-B'.

Referring to FIG. 5, the display panel 10 may include the substrate 100, the insulating layer IL, the third pixel circuit PC3, an organic light-emitting diode OLED as a display element, and a pixel-defining layer 215.

The substrate 100 may include glass or a polymer resin such as polyethersulfone, polyarylate, polyetherimide, polyethylene naphthalate, polyethylene terephthalate, polyphenylene sulfide, polyimide, polycarbonate, cellulose triacetate, cellulose acetate propionate, or the like. In an embodiment, the substrate 100 may have a multi-layer structure including a base layer and a barrier layer (not shown), the base layer including the polymer resin described above. The substrate 100 including the polymer resin may be flexible, rollable, or bendable.

The insulating layer IL may be arranged on the substrate 100. The insulating layer IL may include an inorganic insulating layer IIL and an organic insulating layer OIL. In an embodiment, the inorganic insulating layer IIL may include a buffer layer 111, a first gate insulating layer 112, a second gate insulating layer 113, a first inorganic insulating layer 115, a second inorganic insulating layer 117, and an interlayer insulating layer 119.

The third pixel circuit PC3 may be arranged in the third area AR3. The third pixel circuit PC3 may include a first thin-film transistor TFT1, a second thin-film transistor TFT2, and a storage capacitor Cst. The first thin-film transistor TFT1 may include a first semiconductor layer Act1, a first gate electrode GE1, a first source electrode SE1, and a first drain electrode DE1. The second thin-film transistor TFT2 may include a second semiconductor layer Act2, a second gate electrode GE2, a second source electrode SE2, and a second drain electrode DE2. The storage capacitor Cst may include a lower electrode CE1 and an upper electrode CE2.

The buffer layer 111 may be arranged on the substrate 100. The buffer layer 111 may include an inorganic insulating material such as $SiN_X$, SiON, and $SiO_2$, and may have a single layer or multiple layers including the inorganic insulating materials described above.

The first semiconductor layer Act1 may include a silicon semiconductor. The first semiconductor layer Act1 may include polysilicon. In some embodiments, the first semiconductor layer Act1 may include amorphous silicon. In some embodiments, the first semiconductor layer Act1 may include an oxide semiconductor or an organic semiconductor. The first semiconductor layer Act1 may include a channel area, a drain area, and a source area, the drain area and the source area being respectively arranged at opposite sides of the channel area. The first gate electrode GE1 may overlap the channel area.

The first gate electrode GE1 may overlap the first semiconductor layer Act1. The first gate electrode GE1 may include a low-resistance metal material. The first gate electrode GE1 may include a conductive material including molybdenum (Mo), aluminum (Al), copper (Cu), titanium (Ti), or the like, and may be provided as multiple layers or a single layer including the materials described above.

The first gate insulating layer 112 may be arranged between the first semiconductor layer Act1 and the first gate electrode GE1. Thus, the first semiconductor layer Act1 may be insulated from the first gate electrode GE1. The first gate insulating layer 112 may include an inorganic insulating material, such as $SiO_2$, $SiN_X$, SiON, $Al_2O_3$, $TiO_2$, $Ta_2O_5$, $HfO_2$, and/or ZnO.

The second gate insulating layer 113 may cover the first gate electrode GE1. The second gate insulating layer 113 may be arranged on the first gate electrode GE1. Similar to the first gate insulating layer 112, the second gate insulating layer 113 may include an inorganic insulating material, such as $SiO_2$, $SiN_X$, SiON, $Al_2O_3$, $TiO_2$, $Ta_2O_5$, $HfO_2$, and/or ZnO.

The upper electrode CE2 may be arranged on the second gate insulating layer 113. The upper electrode CE2 may overlap the first gate electrode GE1 in a plan view. In this case, the upper electrode CE2 and the first gate electrode GE1 may overlap each other with the second gate insulating layer 113 interposed therebetween, and may constitute the storage capacitor Cst. In other words, the first gate electrode GE1 of the first thin-film transistor TFT1 may function as the lower electrode CE1 of the storage capacitor Cst.

As described above, the storage capacitor Cst and the first thin-film transistor TFT1 may overlap each other. In some embodiments, the storage capacitor Cst may not overlap the first thin-film transistor TFT1.

The upper electrode CE2 may include aluminum (Al), platinum (Pt), palladium (Pd), silver (Ag), magnesium (Mg), gold (Au), nickel (Ni), neodymium (Nd), iridium (Ir), chrome (Cr), calcium (Ca), Mo, Ti, tungsten (W), and/or Cu, and may have a single layer or multiple layers of the materials described above.

The first inorganic insulating layer 115 may cover the upper electrode CE2. In an embodiment, the first inorganic insulating layer 115 may cover the first gate electrode GE1. The first inorganic insulating layer 115 may include $SiO_2$, $SiN_X$, SiON, $Al_2O_3$, $TiO_2$, $Ta_2O_5$, $HfO_2$, ZnO, or the like. The first inorganic insulating layer 115 may include a single layer or multiple layers including the inorganic insulating materials described above.

The second semiconductor layer Act2 may be arranged on the first inorganic insulating layer 115. In an embodiment, the second semiconductor layer Act2 may include a channel area, a source area, and a drain area, the source area and the drain area being respectively arranged at opposite sides of the channel area. The second semiconductor layer Act2 may include an oxide semiconductor. For example, the second semiconductor layer Act2 may include a Zn oxide-based material, such as a Zn oxide, an In—Zn oxide, a Ga—In—Zn oxide, or the like. In some embodiments, the second semiconductor layer Act2 may include an In—Ga—Zn—O (IGZO) semiconductor, an In—Sn—Zn—O (ITZO) semiconductor, or an In—Ga—Sn—Zn—O (IGTZO) semiconductor, which contain a metal, such as indium (In), gallium (Ga), stannum (Sn), in ZnO.

The source area and the drain area of the second semiconductor layer Act2 may be formed by adjusting a carrier concentration of an oxide semiconductor to make the oxide semiconductor conductive. For example, the source area and the drain area of the second semiconductor layer Act2 may be formed by increasing the carrier concentration of the oxide semiconductor through plasma treatment using a hydrogen-based gas, a fluorine-based gas, or a combination thereof.

The second inorganic insulating layer 117 may cover the second semiconductor layer Act2. The second inorganic insulating layer 117 may be arranged between the second semiconductor layer Act2 and the second gate electrode GE2. In an embodiment, the second inorganic insulating layer 117 may be arranged on the entire substrate 100. In another embodiment, the second inorganic insulating layer 117 may be patterned according to a shape of the second gate electrode GE2. The second inorganic insulating layer 117 may include $SiO_2$, $SiN_X$, SiON, $Al_2O_3$, $TiO_2$, $Ta_2O_5$, $HfO_2$, ZnO, or the like. The second inorganic insulating layer 117 may include a single layer or multiple layers including the inorganic insulating materials described above.

The second gate electrode GE2 may be arranged on the second inorganic insulating layer 117. The second gate electrode GE2 may overlap the second semiconductor layer Act2. The second gate electrode GE2 may overlap the channel area of the second semiconductor layer Act2. The second gate electrode GE2 may include a conductive material including Mo, Al, Cu, Ti, or the like, and may be provided as multiple layers or a single layer including the materials described above.

The interlayer insulating layer 119 may cover the second gate electrode GE2. The interlayer insulating layer 119 may include $SiO_2$, $SiN_X$, SiON, $Al_2O_3$, $TiO_2$, $Ta_2O_5$, $HfO_2$, ZnO, or the like. The interlayer insulating layer 119 may include a single layer or multiple layers including the inorganic insulating materials described above.

The first source electrode SE1 and the first drain electrode DE1 may be arranged on the interlayer insulating layer 119. The first source electrode SE1 and the first drain electrode DE1 may be connected to the first semiconductor layer Act1. The first source electrode SE1 and the first drain electrode DE1 may be connected to the first semiconductor layer Act1 through contact holes in the insulating layers.

The second source electrode SE2 and the second drain electrode DE2 may be arranged on the interlayer insulating layer 119. The second source electrode SE2 and the second drain electrode DE2 may be electrically connected to the second semiconductor layer Act2. The second source electrode SE2 and the second drain electrode DE2 may be electrically connected to the second semiconductor layer Act2 through contact holes in the insulating layers.

The first source electrode SE1, the first drain electrode DE1, the second source electrode SE2, and the second drain electrode DE2 may include a material having good conductivity. The first source electrode SE1, the first drain electrode DE1, the second source electrode SE2, and the second drain electrode DE2 may include a conductive material including Mo, Al, Cu, Ti, or the like, and may include a single layer or multiple layers including the materials described above. In an embodiment, the first source electrode SE1, the first drain electrode DE1, the second source electrode SE2, and the second drain electrode DE2 may have a multi-layer structure of a Ti layer, an Al layer, and another Ti layer.

The first thin-film transistor TFT1 including a silicon semiconductor as the first semiconductor layer Act1 is highly reliable, and thus, the first thin-film transistor TFT1 may be employed as a driving thin-film transistor. Thereby, the display panel 10 of a high quality may be implemented.

Because the oxide semiconductor has high carrier mobility and low leakage current, a voltage drop may not be large even when a driving time is long. In other words, even during a low-frequency driving, a color change of an image according to a voltage drop is not large, and thus, a display device may be driven at low frequencies. Because the oxide semiconductor has low leakage current as described above, the oxide semiconductor may be employed in at least one of thin-film transistors other than the driving thin-film transistor, thus reducing power consumption while preventing leakage current. For example, the second thin-film transistor TFT2 may be employed as a switching thin-film transistor.

A bottom gate electrode BGE may be arranged below the second semiconductor layer Act2. In an embodiment, the bottom gate electrode BGE may be arranged between the second gate insulating layer 113 and the first inorganic insulating layer 115. In an embodiment, the bottom gate electrode BGE may receive a gate signal. In this case, the second thin-film transistor TFT2 may have a dual gate electrode structure in which gate electrodes are respectively arranged at upper and lower portions of the second semiconductor layer Act2.

In an embodiment, a line WL may be arranged between the second inorganic insulating layer 117 and the interlayer insulating layer 119. In an embodiment, the line WL may be connected to the bottom gate electrode BGE through a contact hole provided in the first inorganic insulating layer 115 and the second inorganic insulating layer 117.

In an embodiment, a bottom shielding layer BSL may be arranged between the substrate 100 and the third pixel circuit PC3 overlapping the third area AR3. In an embodiment, the bottom shielding layer BSL may overlap the first thin-film transistor TFT1. A static voltage may be applied to the bottom shielding layer BSL. As the bottom shielding layer BSL is arranged below the first thin-film transistor TFT1, the first thin-film transistor TFT1 is less affected by ambient interference signals, thereby improving reliability.

The bottom shielding layer BSL may include a transparent conductive material. For example, the bottom shielding layer BSL may include a transparent conductive oxide TCO. The bottom shielding layer BSL may include a conductive oxide, such as ITO, IZO, ZnO, $In_2O_3$, IGO, or AZO.

The organic insulating layer OIL may be arranged on the inorganic insulating layer IIL. In an embodiment, the organic insulating layer OIL may be arranged on the substrate 100. The organic insulating layer OIL may include a first organic insulating layer OIL1 and a second organic insulating layer OIL2. The first organic insulating layer OIL1 may cover the first source electrode SE1, the first drain electrode DE1, the second source electrode SE2, and the second drain electrode DE2. The first organic insulating layer OIL1 may include an organic material. For example, the first organic insulating layer OIL1 may include an organic insulating material, such as a general-purpose polymer such as poly(methyl methacrylate) (PMMA) and polystyrene (PS), polymer derivatives having a phenol-based group, an acryl-based polymer, an imide-based polymer, aryl ether-based polymer, an amide-based polymer, a fluorine-based polymer, a p-xylene-based polymer, a vinyl alcohol-based polymer, and any blends thereof.

A connection electrode CM may be arranged on the first organic insulating layer OIL1. In this case, the connection electrode CM may be connected to the first drain electrode DE1 or the first source electrode SE1 through a contact hole in the first organic insulating layer OIL1.

The connection electrode CM may include a material having good conductivity. The connection electrode CM may include a conductive material including Mo, Al, Cu, Ti, or the like, and may have multiple layers or a single layer including the materials described above. In an embodiment, the connection electrode CM may have a multi-layer structure of a Ti layer, an Al layer, and another Ti layer.

The second organic insulating layer OIL2 may cover the connection electrode CM. The second organic insulating layer OIL2 may include an organic material. For example, the second organic insulating layer OIL2 may include an organic insulating material, such as a general-purpose polymer such as PMMA and PS, polymer derivatives having a phenol-based group, an acryl-based polymer, an imide-based polymer, aryl ether-based polymer, an amide-based polymer, a fluorine-based polymer, a p-xylene-based polymer, a vinyl alcohol-based polymer, and any blends thereof.

The organic light-emitting diode OLED as a display element may be arranged on the organic insulating layer OIL. The organic light-emitting diode OLED may be electrically connected to a pixel circuit. The organic light-emitting diode OLED may be electrically connected to the third pixel circuit PC3 in the third area AR3, thereby implementing the third pixel PX3. In an embodiment, the organic light-emitting diode OLED may overlap the third pixel circuit PC3. The organic light-emitting diode OLED may include a pixel electrode 211, an intermediate layer 212, and an opposite electrode 213.

The pixel electrode 211 may be arranged on the organic insulating layer OIL. The pixel electrode 211 may be electrically connected to the connection electrode CM through a contact hole provided in the second organic insulating layer OIL2. The pixel electrode 211 may include a conductive oxide, such as ITO, IZO, ZnO, $In_2O_3$, IGO, or AZO. In another embodiment, the pixel electrode 211 may include a reflective layer including Ag, Mg, Al, Pt, Pd, Au, Ni, Nd, Ir, Cr, or any compounds thereof. In another embodiment, the pixel electrode 211 may further include a layer including ITO, IZO, ZnO, or $In_2O_3$, on or below the reflective layer described above.

The pixel-defining layer 215 having an opening 2150P exposing a central portion of the pixel electrode 211 may be arranged on the pixel electrode 211. The pixel-defining layer 215 may include an organic insulating material and/or an inorganic insulating material. An opening 2150P may define an emission area of light emitted by the organic light-emitting diode OLED.

The intermediate layer 212 may include a low-molecular weight material or a polymer material and may emit red, green, blue, or white light. When the intermediate layer 212 includes the low-molecular weight material, the intermediate layer 212 may have a structure in which a hole injection layer (HIL), a hole transport layer (HTL), an emission layer (EML), an electron transport layer (ETL), or an electron injection layer (EIL) are stacked in a single or complex structure, and may include various organic materials including copper phthalocyanine (CuPc), N,N'-Di(naphthalene-1-yl)-N,N'-diphenyl-benzidine (NPB), tris-8-hydroxyquinoline aluminum (Alq3), or the like. These layers may be formed using a vacuum deposition method.

When the intermediate layer 212 includes the polymer material, the intermediate layer 212 may have a structure that includes the HTL and the EML. In this case, the HTL may include poly(3,4-ethylenedioxythiophene) (PEDOT), and the EML may include a polymer material, such as a poly-phenylenevinylene (PPV)-based material and a polyfluorene-based material. The intermediate layer 212 may be formed through screen printing, inkjet printing, laser induced thermal imaging (LITI), etc.

The opposite electrode 213 may be arranged on the intermediate layer 212. The opposite electrode 213 may include a conductive material having a low work function. For example, the opposite electrode 213 may include a (semi-)transparent layer including Ag, Mg, Al, Pt, Pd, Au, Ni, Nd, Ir, Cr, Li, Ca, or any alloys thereof. In some embodiments, the opposite electrode 213 may further include a layer including ITO, IZO, ZnO, or $In_2O_3$, on the (semi-)transparent layer including the materials described above.

Figure 6:
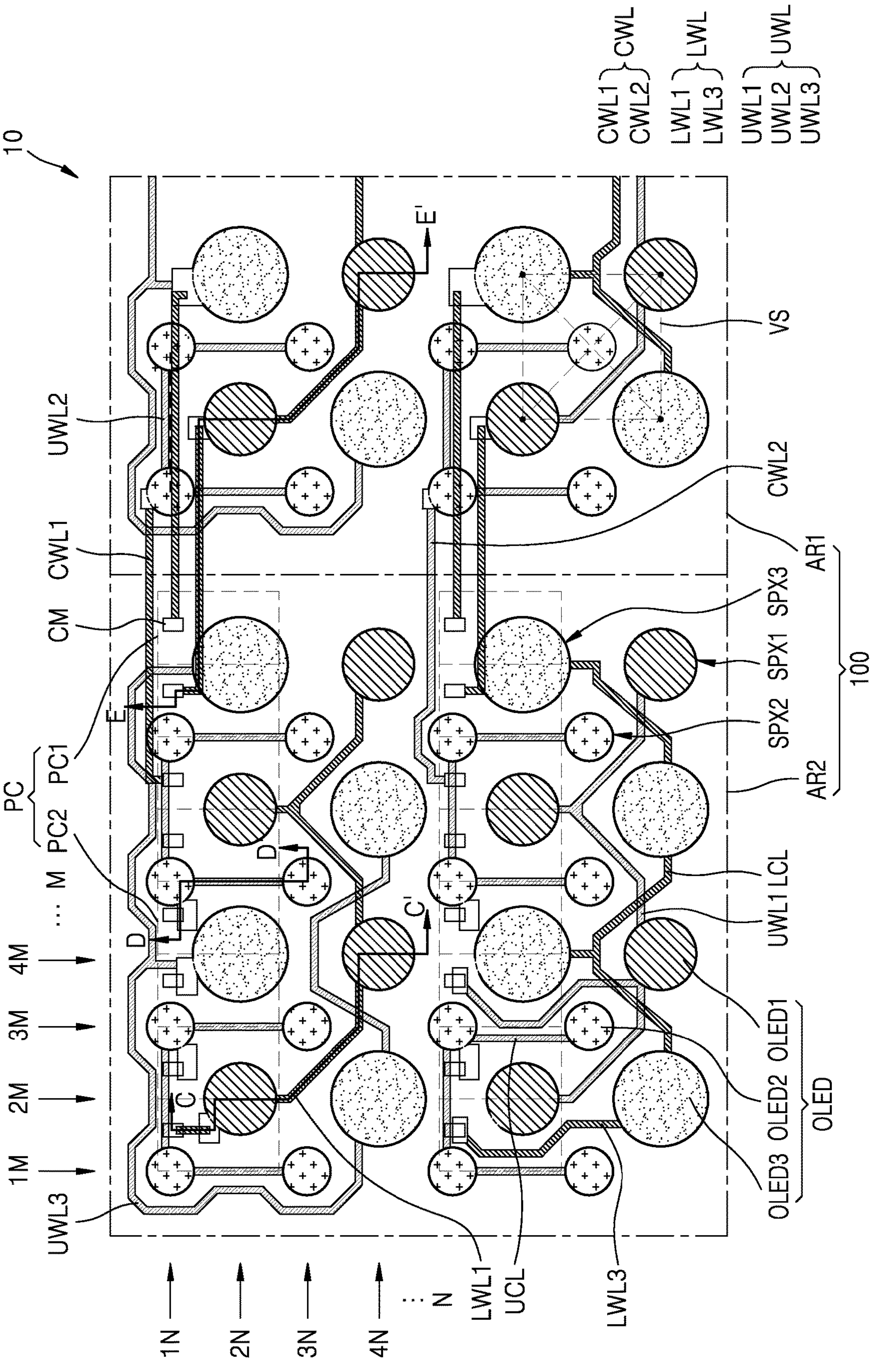
FIG. 6 is an enlarged view of a first area and a second area of the display panel in FIG. 4.

FIG. 6 is an enlarged view of the first area AR1 and the second area AR2 of the display panel 10 in FIG. 4.

Referring to FIG. 6, the display panel 10 may include a substrate 100, the pixel circuit PC, an organic light-emitting diode OLED, a lower conductive layer LCL, an upper conductive layer UCL, a connection electrode CM, and a connection line CWL, the organic light-emitting diode OLED being a display element.

In an embodiment, the substrate 100 may include the first area AR1 and the second area AR2. The second area AR2 may be arranged adjacent to the first area AR1.

The pixel circuit PC may be arranged on the substrate 100. The pixel circuit PC may be electrically connected to the organic light-emitting diode OLED which is a display element. In an embodiment, the pixel circuit PC may include the first pixel circuit PC1 and the second pixel circuit PC2. The first pixel circuit PC1 and the second pixel circuit PC2 may be arranged in the second area AR2. The first pixel circuit PC1 and the second pixel circuit PC2 may not be arranged in the first area AR1. Thus, light transmittance of the display panel 10 in the first area AR1 may increase.

As a display element, the organic light-emitting diode OLED may be arranged on the substrate 100. A plurality of organic light-emitting diodes OLED may be provided. In an embodiment, the organic light-emitting diode OLED may include a first organic light-emitting diode OLED1 as a first display element, a second organic light-emitting diode OLED2 as a second display element, and a third organic light-emitting diode OLED3 as a third display element. In an embodiment, a plurality of first organic light-emitting diodes OLED1, a plurality of second organic light-emitting diodes OLED2, and a plurality of third organic light-emitting diodes OLED3 may be provided.

The plurality of first organic light-emitting diodes OLED1 may be arranged in the first area AR1 and the second area AR2. The plurality of second organic light-emitting diodes OLED2 may be arranged in the first area AR1 and the second area AR2. The plurality of third organic light-emitting diodes OLED3 may be arranged in the first area AR1 and the second area AR2.

In an embodiment, the plurality of display elements may include a first sub-pixel SPX1, a second sub-pixel SPX2, and a third sub-pixel SPX3 which emit light of different wavelengths from one another. In this specification, a sub-pixel denotes a smallest unit for realizing an image which corresponds to an emission area. When an organic light-emitting diode is implemented as a display element, the emission area may be defined by an opening of a pixel-defining layer.

In an embodiment, the first organic light-emitting diode OLED1 as the first display element may implement a first sub-pixel SPX1. The second organic light-emitting diode OLED2 as the second display element may constitute a second sub-pixel SPX2. The third organic light-emitting diode OLED3 as the third display element may constitute a third sub-pixel SPX3.

In an embodiment, the first sub-pixel SPX1, the second sub-pixel SPX2, and the third sub-pixel SPX3 may emit red light, green light, and blue light, respectively. In another embodiment, the display panel 10 may further include a fourth sub-pixel. The fourth sub-pixel may emit white light.

The first sub-pixel SPX1, the second sub-pixel SPX2, and the third sub-pixel SPX3 may be arranged in a pentile configuration. In a first row 1N, the plurality of second sub-pixels SPX2 may be spaced apart from each other by a distance. In a second row 2N adjacent to the first row 1N, the plurality of first sub-pixels SPX1 and the plurality of third sub-pixels SPX3 may be alternately arranged. In a third row 3N adjacent to the second row 2N, the plurality of second sub-pixels SPX2 may be spaced apart from each other by a distance. In a fourth row 4N adjacent to the third row 3N, the plurality of first sub-pixels SPX1 and the plurality of third sub-pixels SPX3 may be alternately arranged. This arrangement of sub-pixels may be repeated up to an $N^{th}$ row. In an embodiment, the first sub-pixel SPX1 and the third sub-pixel SPX3 may be larger in size than the second sub-pixel SPX2.

The plurality of second sub-pixels SPX2 arranged in the first row 1N, and the plurality of first sub-pixels SPX1 and the plurality of third sub-pixels SPX3 arranged in the second row 2N may be arranged in a staggered manner. Thus, in a first column 1M, the plurality of second sub-pixels SPX2 may be space apart from each other by a distance. In a second column 2M adjacent to the first column 1M, the plurality of first sub-pixels SPX1 and the plurality of third sub-pixels SPX3 may be alternately arranged. In a third column 3M adjacent to the second column 2M, the plurality of second sub-pixels SPX2 may be apart from each other by a distance. In a fourth column 4M adjacent to the third column 3M, the plurality of first sub-pixels SPX1 and the plurality of third sub-pixels SPX3 may be alternately arranged. This arrangement of sub-pixels may be repeated up to an $M^{th}$ column.

In other words, the second sub-pixel SPX2 may be arranged in a center of a virtual quadrilateral VS formed by lines connecting centers of two first subpixels SPX1 and two third subpixels SPX3 disposed adjacent to the second sub-pixel SPX2. In an embodiment, a center point of the second sub-pixel SPX2 may be a center point of the virtual quadrilateral VS. The first sub-pixel SPX1 and the third sub-pixel SPX3 may be arranged at vertices of the virtual quadrilateral VS, respectively. In an embodiment, the first sub-pixel SPX1 may be arranged at a first vertex and a third vertex facing each other among vertices of the virtual quadrilateral VS. The third sub-pixel SPX3 may be arranged at a second vertex and a fourth vertex facing each other among the vertices of the virtual quadrilateral VS. The virtual quadrilateral VS may be a rectangle, a rhombus, a square, etc., and may be variously modified.

This sub-pixel arrangement structure is referred to as a PenTile™ Matrix structure, or a PenTile structure, and by applying a rendering driving that expresses color by sharing adjacent sub-pixels, a high resolution may be implemented with a small number of sub-pixels.

In FIG. 6, the first sub-pixel SPX1, the second sub-pixel SPX2, and the third sub-pixel SPX3 are arranged in a PenTile Matrix structure, but the present disclosure is not limited thereto. In another embodiment, the first sub-pixel SPX1, the second sub-pixel SPX2, and the third sub-pixel SPX3 may be arranged in various shapes, such as a stripe structure, a mosaic array structure, a delta array structure, or the like.

In an embodiment, an arrangement structure of sub-pixels in the first area AR1 may be the same as an arrangement structure of sub-pixels in the second area AR2. In another embodiment, the arrangement structure of the sub-pixels in the first area AR1 may be different from the arrangement structure of the sub-pixels in the second area AR2.

The lower conductive layer LCL may be arranged in at least one of the first area AR1 and the second area AR2. The lower conductive layer LCL may include a lower line LWL that connects one of the plurality of organic light-emitting diodes OLED and the other one of the plurality of organic light-emitting diodes OLED to each other. In an embodiment, the lower conductive layer LCL may include a first lower line LWL1 that electrically connects one of the plurality of first organic light-emitting diodes OLED1 and the other one of the plurality of first organic light-emitting diodes OLED1 to each other. Although not shown, in an embodiment, the lower conductive layer LCL may include a second lower line that electrically connects one of the plurality of second organic light-emitting diodes OLED2 and the other one of the plurality of second organic light-emitting diodes OLED2 to each other. In an embodiment, the lower conductive layer LCL may include a third lower line LWL3 that electrically connects one of the plurality of third organic light-emitting diodes OLED3 and the other one of the plurality of third organic light-emitting diodes OLED3 to each other. Thus, the plurality of organic light-emitting diodes OLED may be electrically connected to one pixel circuit PC, and the number of pixel circuits PC may be reduced.

The upper conductive layer UCL may be arranged in at least one of the first area AR1 and the second area AR2. The upper conductive layer UCL may include an upper line UWL that connects one of the plurality of organic light-emitting diodes OLED and the other one of the plurality of organic light-emitting diodes OLED to each other. In an embodiment, the upper conductive layer UCL may include a first upper line UWL1 that electrically connects one of the plurality of first organic light-emitting diodes OLED1 and the other one of the plurality of first organic light-emitting diodes OLED1 to each other. In an embodiment, the upper conductive layer UCL may include a second upper line UWL2 that electrically connects one of the plurality of second organic light-emitting diodes OLED2 and the other one of the plurality of second organic light-emitting diodes OLED2 to each other. In an embodiment, the upper conductive layer UCL may include a third upper line UWL3 that electrically connects one of the plurality of third organic light-emitting diodes OLED3 and the other one of the plurality of third organic light-emitting diodes OLED3 to each other. Thus, the plurality of organic light-emitting diodes OLED may be electrically connected to one pixel circuit PC, and the number of pixel circuits PC may be reduced.

The lower line LWL and the upper line UWL may at least partially overlap each other. The lower line LWL and the upper line UWL may be arranged on different layers from each other. In an embodiment, the lower line LWL included in the lower conductive layer LCL may be arranged below a reference insulating layer. The upper line UWL included in the upper conductive layer UCL may be arranged above the reference insulating layer. Thus, even when the lower line LWL and the upper line UWL at least partially overlap each other, a short circuit between the lines may not occur, and the degree of freedom in the arrangement of the lower line LWL and the arrangement of the upper line UWL may be increased. In an embodiment, the reference insulating layer may be the organic insulating layer OIL in FIG. 5.

At least one of the lower conductive layer LCL and the upper conductive layer UCL may include a transparent conductive material. For example, at least one of the lower conductive layer LCL and the upper conductive layer UCL may include a TCO. At least one of the lower conductive layer LCL and the upper conductive layer UCL may include a conductive oxide, such as ITO, IZO, ZnO, $In_2O_3$, IGO, or AZO.

The connection electrode CM may be arranged in the second area AR2. A plurality of connection electrodes CM may be provided in the second area AR2. In an embodiment, the plurality of connection electrodes CM may be spaced apart from each other side by side. The connection electrode CM may electrically connect the second pixel circuit PC2 and the organic light-emitting diode OLED to each other.

The connection line CWL may electrically connect the first pixel circuit PC1 and the organic light-emitting diode OLED, which is a display element arranged in the first area AR1, to each other. The connection line CWL may extend to the second area AR2 from the first area AR1 and may overlap the first area AR1 and the second area AR2. In an embodiment, the connection line CWL may extend to the first area AR1 from the connection electrode CM electrically connected to the first pixel circuit PC1.

At least one of the lower conductive layer LCL and the upper conductive layer UCL may include the connection line CWL. In an embodiment, the lower conductive layer LCL may include a first connection line CWL1 of the connection line CWL. In this case, the lower line LWL and the first connection line CWL1 may be arranged on the same layer. In an embodiment, the upper conductive layer UCL may include a second connection line CWL2 of the connection line CWL. In this case, the upper line UWL and the second connection line CWL2 may be arranged on the same layer. In other words, the connection line CWL may be arranged on the same layer as one of the lower line LWL and the upper line UWL.

Figure 7:
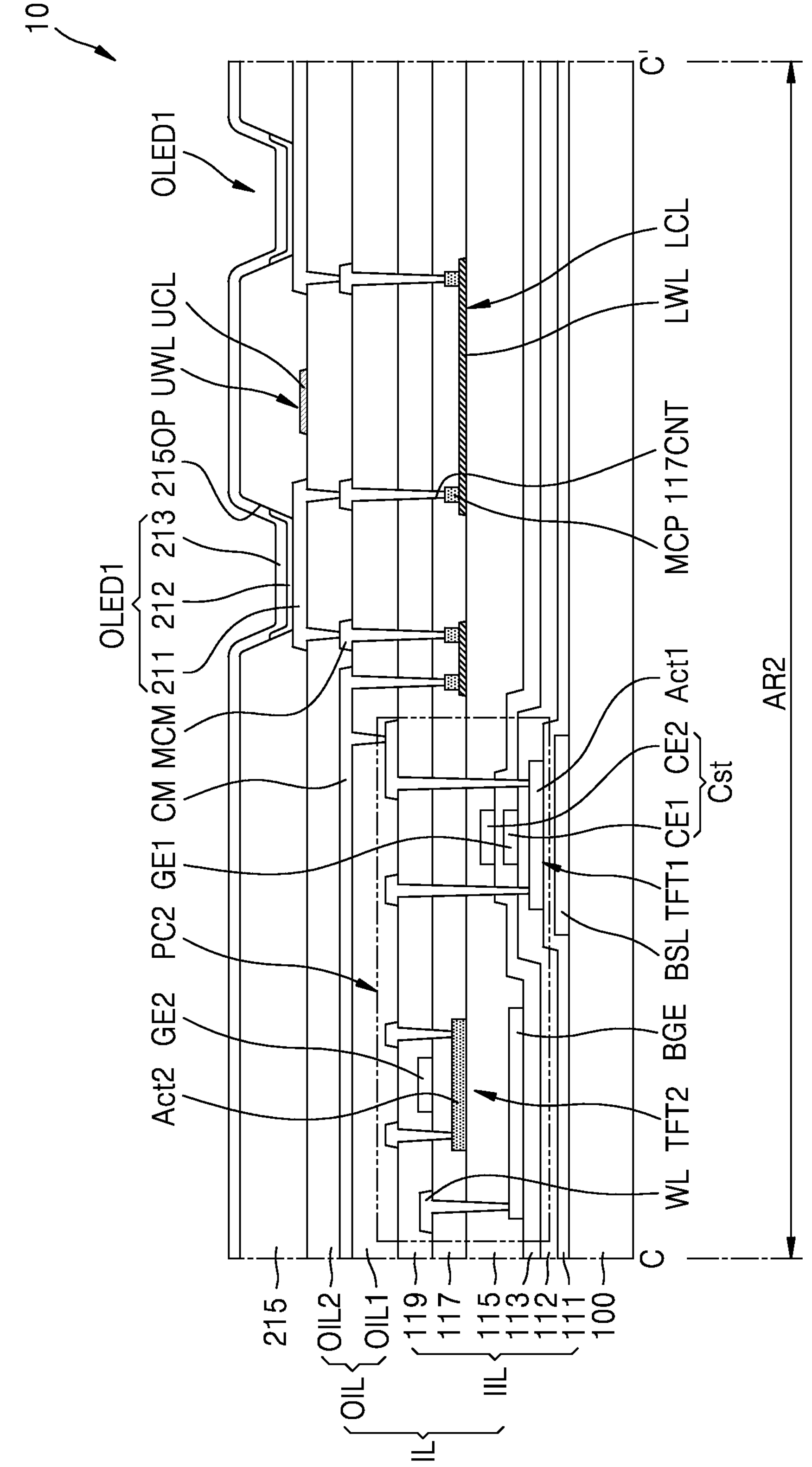
FIG. 7 is a cross-sectional view schematically illustrating the display panel in FIG. 6, taken along line C-C'.
Figure 8:
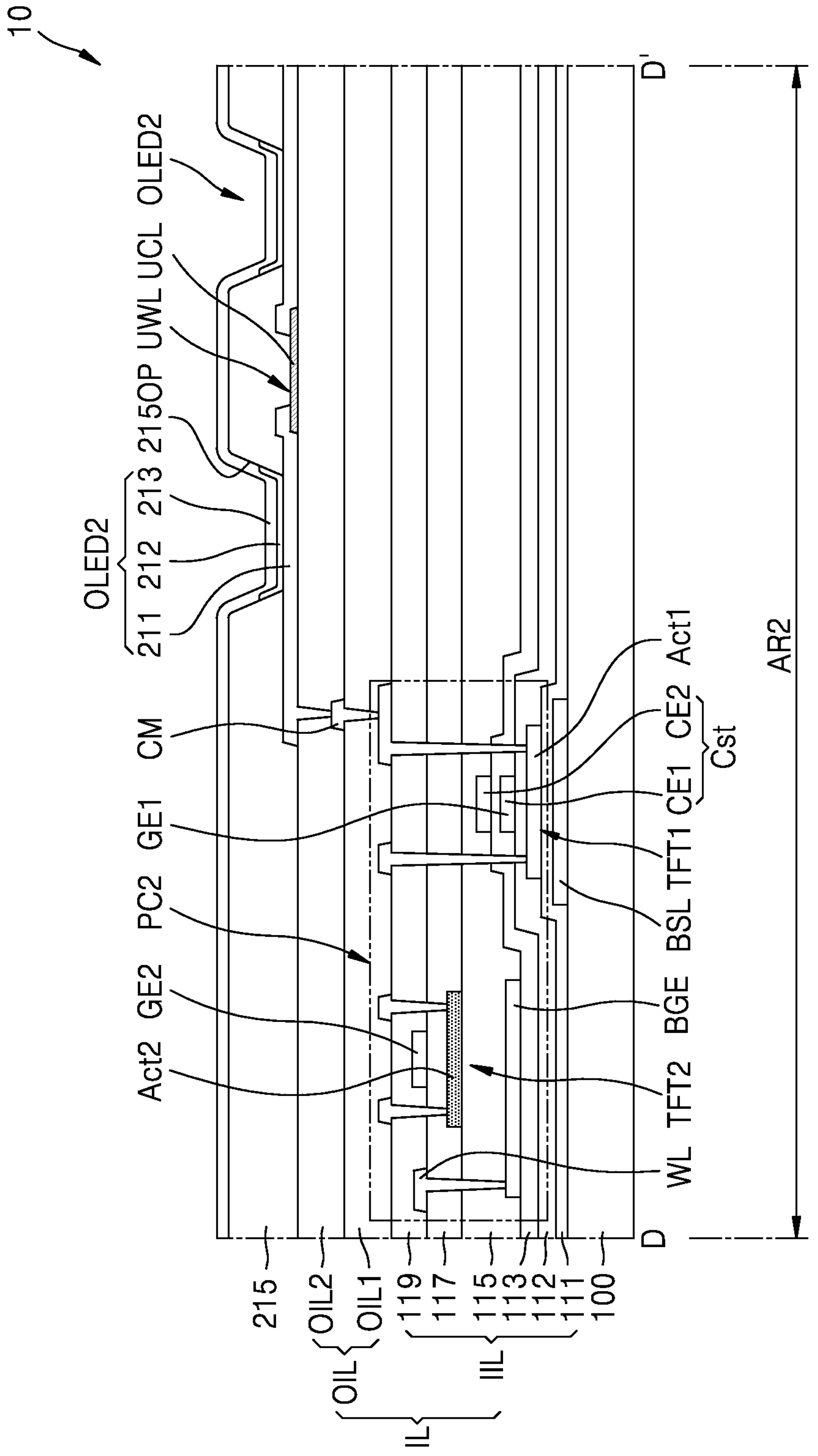
FIG. 8 is a cross-sectional view schematically illustrating the display panel in FIG. 6, taken along line D-D'.

FIG. 7 is a cross-sectional view schematically illustrating the display panel 10 in FIG. 6, taken along a line C-C'. FIG. 8 is a cross-sectional view schematically illustrating the display panel 10 in FIG. 6, taken along a line D-D'. In FIGS. 7 and 8, the same reference numerals as those of FIGS. 5 and 6 denote the same elements, and redundant descriptions will be omitted.

Referring to FIGS. 7 and 8, the display panel 10 may include the substrate 100, an insulating layer IL, the second pixel circuit PC2, an organic light-emitting diode OLED1 and OLED2, the lower line LWL, and the upper line UWL, the organic light-emitting diode being a display element. The insulating layer IL may include an inorganic insulating layer IIL and an organic insulating layer OIL. The second pixel circuit PC2 may be arranged in the second area AR2 of the substrate 100 and may include a first thin-film transistor TFT1, a second thin-film transistor TFT2, and a storage capacitor Cst.

The inorganic insulating layer IIL may be arranged on the substrate 100. In an embodiment, the inorganic insulating layer IIL may include a buffer layer 111, a first gate insulating layer 112, a second gate insulating layer 113, a first inorganic insulating layer 115, a second inorganic insulating layer 117, and an interlayer insulating layer 119.

A first semiconductor layer Act1 of the first thin-film transistor TFT1 may include a silicon semiconductor and may be arranged on the substrate 100. In an embodiment, the first semiconductor layer Act1 may be arranged on the buffer layer 111, and a bottom shielding layer BSL may be arranged between the substrate 100 and the buffer layer 111. The first gate insulating layer 112 may cover the first semiconductor layer Act1.

A first gate electrode GE1 of the first thin-film transistor TFT1 may be arranged on the first gate insulating layer 112. The first gate electrode GE1 may overlap the first semiconductor layer Act1. In an embodiment, the second gate insulating layer 113 may cover the first gate electrode GE1. In an embodiment, the first inorganic insulating layer 115 may cover the first gate electrode GE1. In an embodiment, the first inorganic insulating layer 115 may cover an upper electrode CE2 of the storage capacitor Cst and a bottom gate electrode BGE.

A second semiconductor layer Act2 of the second thin-film transistor TFT2 may include an oxide semiconductor and may be arranged on the first inorganic insulating layer 115.

The second inorganic insulating layer 117 may cover the second semiconductor layer Act2. A second gate electrode GE2 may overlap the second semiconductor layer Act2. The second gate electrode GE2 may be arranged on the second inorganic insulating layer 117.

The interlayer insulating layer 119 may cover the second gate electrode GE2. A first source electrode and a first drain electrode of the first thin-film transistor TFT1 and a second source electrode and a second drain electrode of the second thin-film transistor TFT2 may be arranged on the interlayer insulating layer 119.

The organic insulating layer OIL may be arranged on the inorganic insulating layer IIL. In an embodiment, the organic insulating layer OIL may be arranged on the substrate 100. The organic insulating layer OIL may include a first organic insulating layer OIL1 and a second organic insulating layer OIL2.

In an embodiment, the connection electrode CM may be arranged between the first organic insulating layer OIL1 and the second organic insulating layer OIL2. The connection electrode CM may be electrically connected to the second pixel circuit PC2. For example, the connection electrode CM may be electrically connected to the first thin-film transistor TFT1 through a contact hole in the first organic insulating layer OIL1.

Referring to FIG. 7, the lower conductive layer LCL may be arranged on the first inorganic insulating layer 115. In an embodiment, the lower conductive layer LCL may be arranged between the first inorganic insulating layer 115 and the second inorganic insulating layer 117. In an embodiment, the lower conductive layer LCL may include the lower line LWL.

An intermediate conductive pattern MCP may be arranged on the lower conductive layer LCL. In an embodiment, the intermediate conductive pattern MCP may be arranged on the lower line LWL. In an embodiment, the intermediate conductive pattern MCP may be directly connected to the lower conductive layer LCL. In some embodiments, the intermediate conductive pattern MCP may be arranged directly on the lower conductive layer LCL. Thus, the number of masks used for manufacturing the display panel 10 may be reduced.

In an embodiment, the second semiconductor layer Act2 and the intermediate conductive pattern MCP may include the same material. For example, each of the second semiconductor layer Act2 and the intermediate conductive pattern MCP may include an oxide semiconductor. In this case, the second semiconductor layer Act2 and the intermediate conductive pattern MCP may be formed simultaneously, and the number of masks used for manufacturing the display panel 10 may be reduced.

The second inorganic insulating layer 117 may cover the second semiconductor layer Act2 and the intermediate conductive pattern MCP. In an embodiment, the second inorganic insulating layer 117 may include a contact hole 117CNT overlapping the intermediate conductive pattern MCP. In addition, the second inorganic insulating layer 117 may include a contact hole overlapping the second semiconductor layer Act2. The intermediate conductive pattern MCP may be omitted. In this case, the lower conductive layer LCL may be exposed through the contact hole 117CNT. The intermediate conductive pattern MCP arranged on the lower conductive layer LCL may prevent or reduce damage to the lower conductive layer LCL when the contact hole 117CNT is formed in the second inorganic insulating layer 117.

A plurality of organic light-emitting diodes as a plurality of display elements may be arranged on the organic insulating layer OIL. In an embodiment, the plurality of organic light-emitting diodes may include the plurality of first organic light-emitting diodes OLED1 as a plurality of first display elements. Each of the plurality of first organic light-emitting diodes OLED1 may include a pixel electrode 211, an intermediate layer 212, and an opposite electrode 213.

The plurality of first organic light-emitting diodes OLED1, for example, at least two first organic light-emitting diodes OLED1, may be electrically connected to the lower conductive layer LCL. In an embodiment, the pixel electrode 211 may be electrically connected to the lower conductive layer LCL through an intermediate connection electrode MCM. The intermediate connection electrode MCM and the connection electrode CM may include the same material. In an embodiment, the intermediate conductive pattern MCP may be arranged between the intermediate connection electrode MCM and the lower conductive layer LCL. The intermediate connection electrode MCM may be electrically connected to the intermediate conductive pattern MCP through the contact hole 117CNT in the second inorganic insulating layer 117.

One of the plurality of first organic light-emitting diodes OLED1 may be electrically connected to the other one of the plurality of first organic light-emitting diodes OLED1 through the lower line LWL. One of the plurality of first organic light-emitting diodes OLED1 and the other one of the plurality of first organic light-emitting diodes OLED1 may be electrically connected to the same pixel circuit, for example, one second pixel circuit PC2. Thus, one of the plurality of first organic light-emitting diodes OLED1 and the other one of the plurality of first organic light-emitting diodes OLED1 may be implemented in the same manner.

A pixel-defining layer 215 may have an opening 2150P overlapping the pixel electrode 211. In an embodiment, a plurality of organic light-emitting diodes as a plurality of display elements may include the plurality of pixel electrodes 211, and the pixel-defining layer 215 may have the plurality of openings 2150P overlapping the plurality of pixel electrodes 211.

Referring to FIG. 8, the upper conductive layer UCL may be arranged on the organic insulating layer OIL. In an embodiment, the upper conductive layer UCL may be arranged between the organic insulating layer OIL and the pixel-defining layer 215.

A plurality of organic light-emitting diodes as a plurality of display elements may be arranged on the organic insulating layer OIL. In an embodiment, the plurality of organic light-emitting diodes may include the plurality of second organic light-emitting diodes OLED2 as a plurality of second display elements. Each of the plurality of second organic light-emitting diodes OLED2 may include a pixel electrode 211, an intermediate layer 212, and an opposite electrode 213.

The plurality of second organic light-emitting diodes OLED2, for example, at least two second organic light-emitting diodes OLED2, may be electrically connected to the upper conductive layer UCL. In an embodiment, the upper conductive layer UCL may include the upper line UWL. In an embodiment, one of the plurality of second organic light-emitting diodes OLED2 may be electrically connected to the other one of the plurality of second organic light-emitting diodes OLED2 through the upper line UWL. Thus, the one of the plurality of second organic light-emitting diodes OLED2 and the other one of the plurality of second organic light-emitting diodes OLED2 may be implemented in the same manner.

One of the plurality of pixel electrodes 211 may at least partially cover one side of the upper line UWL, and the other one of the plurality of pixel electrodes 211 may at least partially cover the other side of the upper line UWL. For example, the upper line UWL may be connected to one of the plurality of pixel electrodes 211 and the other one of the plurality of pixel electrodes 211. In an embodiment, the upper line UWL may not overlap the opening 2150P in the pixel-defining layer 215. In another embodiment, the upper line UWL may overlap the opening 2150P in the pixel-defining layer 215.

In an embodiment, at least a portion of the pixel electrode 211 may cover the upper line UWL to prevent or reduce a short circuit between the upper line UWL and the intermediate layer 212. In the present embodiment, the pixel electrode 211 is disposed between the upper line UWL and the intermediate layer 212 to cover edge of the upper line UWL, the short circuit between the upper line UWL and the intermediate layer 212 may be prevented or reduced.

In an embodiment, the pixel electrode 211 may be directly connected to the upper conductive layer UCL. In some embodiments, the pixel electrode 211 may be directly arranged on the upper conductive layer UCL. Thus, the number of masks used for manufacturing the display panel 10 may be reduced.

Referring again to FIGS. 7 and 8, the lower line LWL may be arranged between the substrate 100 and the organic insulating layer OIL, and the upper line UWL may be arranged on the organic insulating layer OIL. In an embodiment, the lower line LWL and the upper line UWL may at least partially overlap each other, for example, the lower line LWL and the upper line UWL may cross each other. Even when the lower line LWL and the upper line UWL cross each other, a short circuit between the lines may not occur. In addition, the degree of freedom in the arrangement of the lower line LWL and the arrangement of the upper line UWL may increase.

Figure 9:
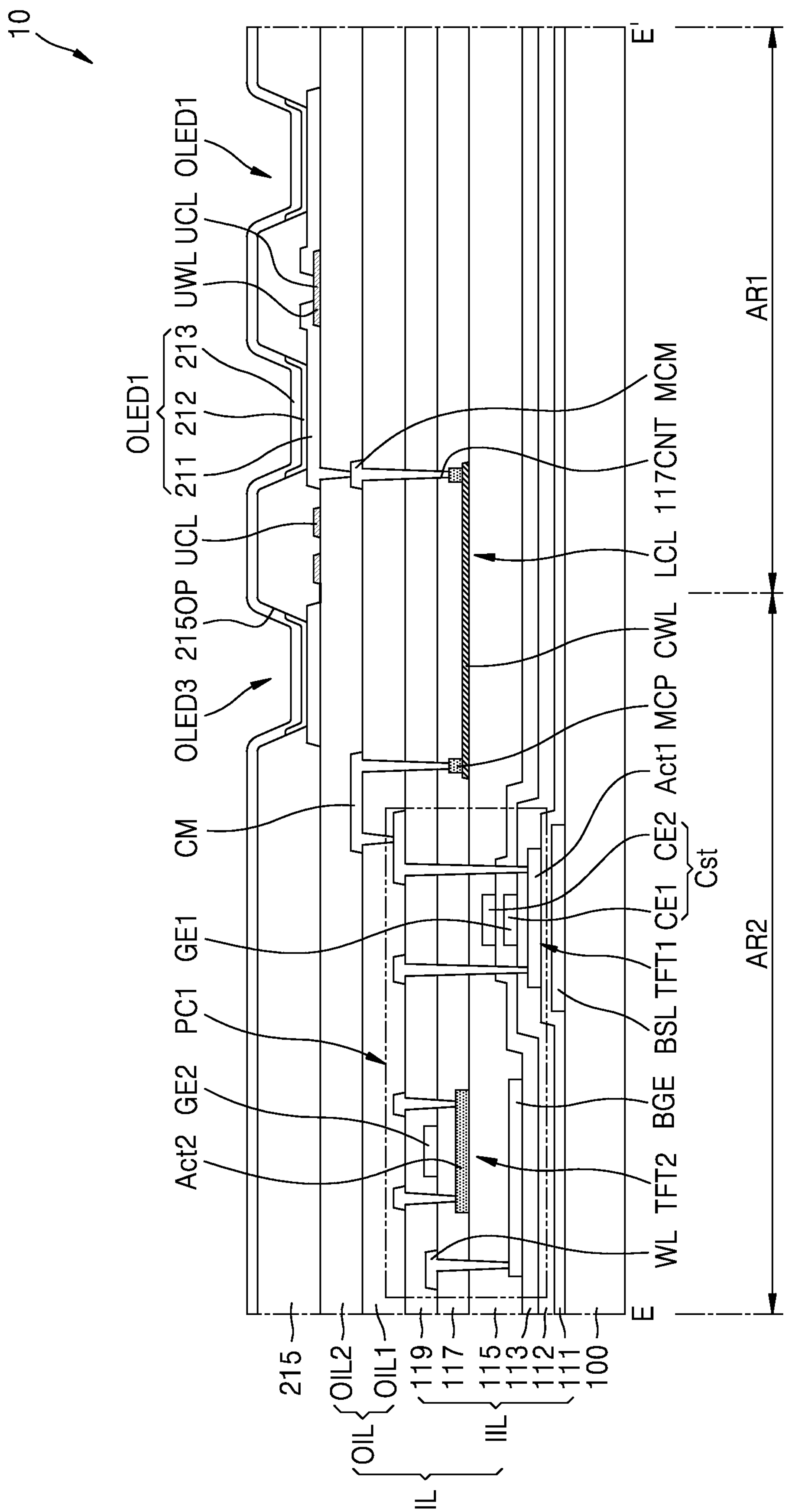
FIG. 9 is a cross-sectional view schematically illustrating the display panel in FIG. 6, taken along line E-E'.

FIG. 9 is a cross-sectional view schematically illustrating the display panel 10 in FIG. 6, taken along a line E-E'. In FIG. 9, the same reference numerals as those of FIGS. 6 to 8 denote the same elements, and redundant descriptions will be omitted.

Referring to FIG. 9, the display panel 10 may include the substrate 100, an insulating layer IL, the first pixel circuit PC1, an organic light-emitting diode as a display element, the lower line, and the upper line UWL. The substrate 100 may include the first area AR1 and the second area AR2. The second area AR2 may be arranged adjacent to the first area AR1. An insulating layer IL may include an inorganic insulating layer IIL and an organic insulating layer OIL. The first pixel circuit PC1 may be arranged in the second area AR2 and may include a first thin-film transistor TFT1, a second thin-film transistor TFT2, and a storage capacitor Cst. The first pixel circuit PC1 may not overlap the first area AR1. In other words, the first pixel circuit PC1 may be arranged in the second area AR2. Thus, light transmittance of the display panel 10 in the first area AR1 may increase.

The inorganic insulating layer IIL may be arranged on the substrate 100. In an embodiment, the inorganic insulating layer IIL may include a buffer layer 111, a first gate insulating layer 112, a second gate insulating layer 113, a first inorganic insulating layer 115, a second inorganic insulating layer 117, and an interlayer insulating layer 119.

The organic insulating layer OIL may be arranged on the inorganic insulating layer IIL. In an embodiment, the organic insulating layer OIL may be arranged on the substrate 100. The organic insulating layer OIL may include a first organic insulating layer OIL1 and a second organic insulating layer OIL2.

In an embodiment, a connection electrode CM may be arranged between the first organic insulating layer OIL1 and the second organic insulating layer OIL2. The connection electrode CM may be electrically connected to the first pixel circuit PC1. For example, the connection electrode CM may be electrically connected to the first thin-film transistor TFT1 through a contact hole in the first organic insulating layer OIL1.

A lower conductive layer LCL may be arranged on the first inorganic insulating layer 115. In an embodiment, the lower conductive layer LCL may be arranged between the first inorganic insulating layer 115 and the second inorganic insulating layer 117.

A plurality of organic light-emitting diodes as a plurality of display elements may be arranged on the organic insulating layer OIL. In an embodiment, the plurality of organic light-emitting diodes may be arranged in the first area AR1 and the second area AR2. In an embodiment, the plurality of organic light-emitting diodes may include the plurality of first organic light-emitting diodes OLED1 as a plurality of first display elements. In an embodiment, the plurality of organic light-emitting diodes may include a plurality of third organic light-emitting diodes OLED3 as a plurality of third display elements.

In the first area AR1, one of the plurality of display elements may be electrically connected to the other one of the plurality of display elements. In an embodiment, in the first area AR1, one of the plurality of first organic light-emitting diodes OLED1 may be electrically connected to the other one of the plurality of first organic light-emitting diodes OLED1 through the upper line UWL.

A pixel-defining layer 215 may have an opening 2150P overlapping a pixel electrode 211. In an embodiment, a plurality of organic light-emitting diodes as a plurality of display elements may include the plurality of pixel electrodes 211, and the pixel-defining layer 215 may have the plurality of openings 2150P overlapping the plurality of pixel electrodes 211.

An upper conductive layer UCL may be arranged on the organic insulating layer OIL. In an embodiment, the upper conductive layer UCL may be arranged between the organic insulating layer OIL and the pixel-defining layer 215.

At least one of the lower conductive layer LCL and the upper conductive layer UCL may include a connection line CWL. In an embodiment, the lower conductive layer LCL may include a first connection line CWL. In this case, the first connection line CWL and the lower line may be arranged on the same layer. The first connection line CWL and the lower line may be arranged between the first inorganic insulating layer 115 and the second inorganic insulating layer 117. In another embodiment, the upper conductive layer UCL may include a second connection line CWL. In this case, the second connection line CWL and the upper line UWL may be arranged on the same layer. The second connection line CWL and the upper line UWL may be arranged between the organic insulating layer OIL and the pixel-defining layer 215. In other words, the connection line CWL may be arranged on the same layer as one of the lower line and the upper line UWL. In another embodiment, the lower conductive layer LCL and the upper conductive layer UCL may include the first connection line CWL and the second connection line CWL, respectively.

The connection line CWL may electrically connect the first pixel circuit PC1 and an organic light-emitting diode which is a display element arranged in the first area AR1 to each other. The connection line CWL may extend to the second area AR2 from the first area AR1 and may overlap the first area AR1 and the second area AR2. In an embodiment, the connection line CWL may extend to the first area AR1 from the connection electrode CM electrically connected to the first pixel circuit PC1. The connection line CWL may include a transparent conductive material. Thus, light transmittance of the display panel 10 in the first area AR1 may be large.

In an embodiment, when the lower conductive layer LCL includes the connection line CWL, the intermediate conductive pattern MCP may be arranged between the connection line CWL and the connection electrode CM. In an embodiment, the intermediate conductive pattern MCP may be arranged between the connection line CWL and the intermediate connection electrode MCM. In an embodiment, when the upper conductive layer UCL includes the connection line CWL, at least a portion of the pixel electrode 211 may cover the connection line CWL.

FIGS. 10A to 10L are cross-sectional views illustrating a method of manufacturing a display device, according to an embodiment. In FIGS. 10A to 10L, the same reference numerals as those of FIG. 9 denote the same elements, and redundant descriptions will be omitted.

Figure 10A:
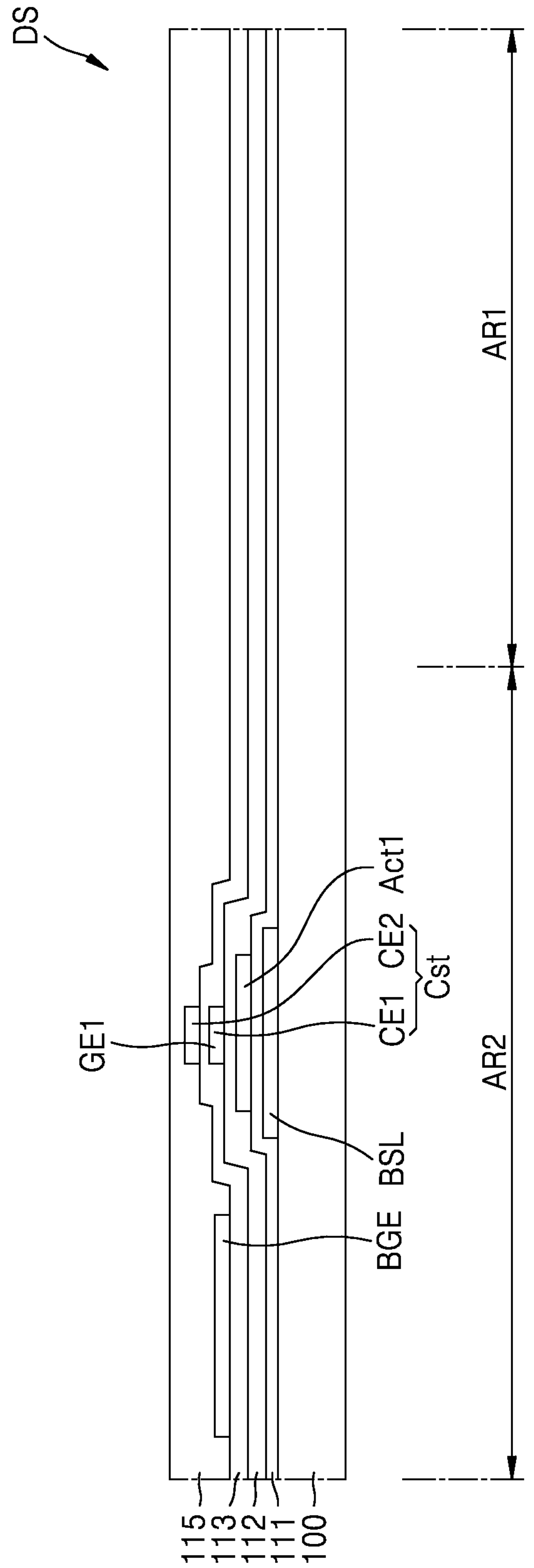
FIGS. 10A, 10B, 10C, 10D, 10E, 10F, 10G, 10H, 10I, 10J, 10K and 10L are cross-sectional views illustrating a method of manufacturing a display device, according to an embodiment.

Referring to FIG. 10A, a display substrate DS may be prepared. The display substrate DS may include a display panel or a display device. In an embodiment, the display substrate DS may include a substrate 100, a first semiconductor layer Act1, a first gate electrode GE1, and a first inorganic insulating layer 115. In an embodiment, the display substrate DS may include the substrate 100, a bottom shielding layer BSL, a buffer layer 111, the first semiconductor layer Act1, a first gate insulating layer 112, the first gate electrode GE1, a second gate insulating layer 113, a storage capacitor Cst, a bottom gate electrode BGE, and the first inorganic insulating layer 115.

The substrate 100 may include a first area AR1 and a second area AR2. The second area AR2 may be arranged adjacent to the first area AR1. The bottom shielding layer BSL may be arranged in the second area AR2 and may not be arranged in the first area AR1. The buffer layer 111 may cover the bottom shielding layer BSL.

The first semiconductor layer Act1 may be arranged on the substrate 100. In an embodiment, the first semiconductor layer Act1 may overlap the second area AR2, but may not overlap the first area AR1. In an embodiment, the first semiconductor layer Act1 may be arranged on the buffer layer 111. The first gate insulating layer 112 may cover the first semiconductor layer Act1.

The first gate electrode GE1 may be arranged to overlap the first semiconductor layer Act1. In an embodiment, the first gate electrode GE1 may be arranged on the first gate insulating layer 112. The second gate insulating layer 113 may cover the first gate electrode GE1.

An upper electrode CE2 of the storage capacitor Cst may be arranged on the second gate insulating layer 113. The first gate electrode GE1 may overlap the upper electrode CE2 in a plan view and may function as a lower electrode CE1 of the storage capacitor Cst. In an embodiment, the bottom gate electrode BGE may be arranged on the second gate insulating layer 113. In an embodiment, the upper electrode CE2 and the bottom gate electrode BGE may be formed on a same layer, include the same material as each other and be formed at the same time.

The first inorganic insulating layer 115 may cover the upper electrode CE2. In an embodiment, the first inorganic insulating layer 115 may cover the first gate electrode GE1. In an embodiment, the first inorganic insulating layer 115 may be arranged on the upper electrode CE2 and the bottom gate electrode BGE.

Figure 10B:
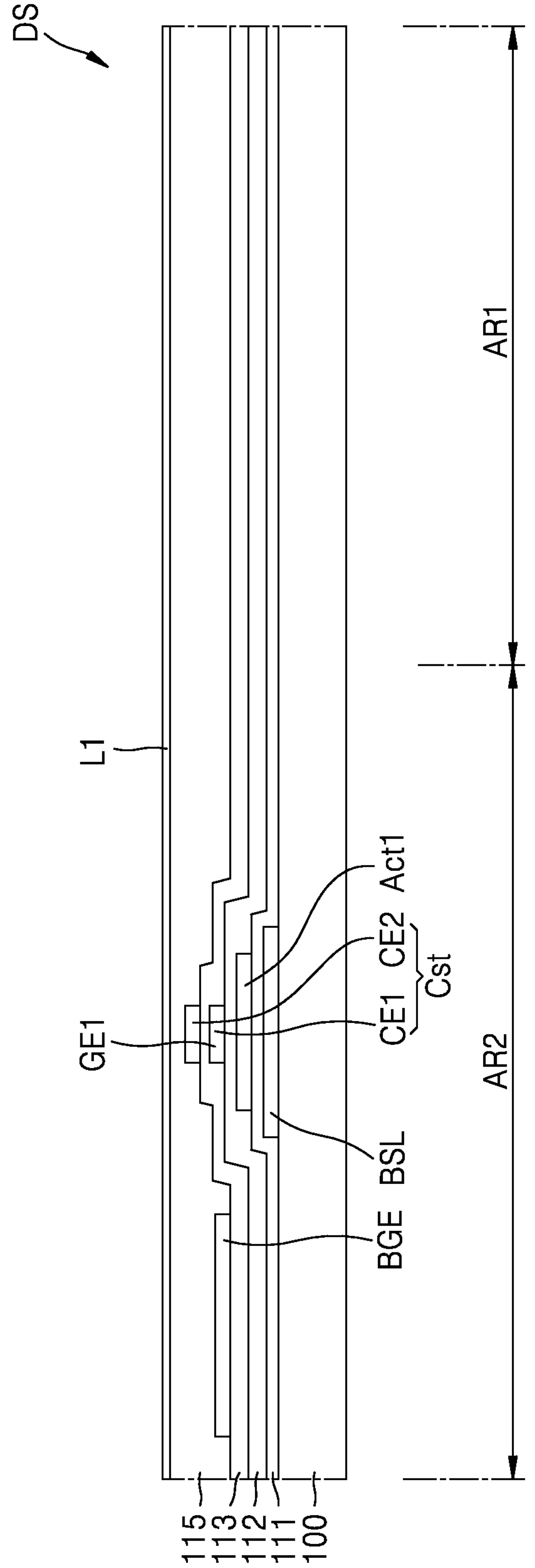
Figure 10C:
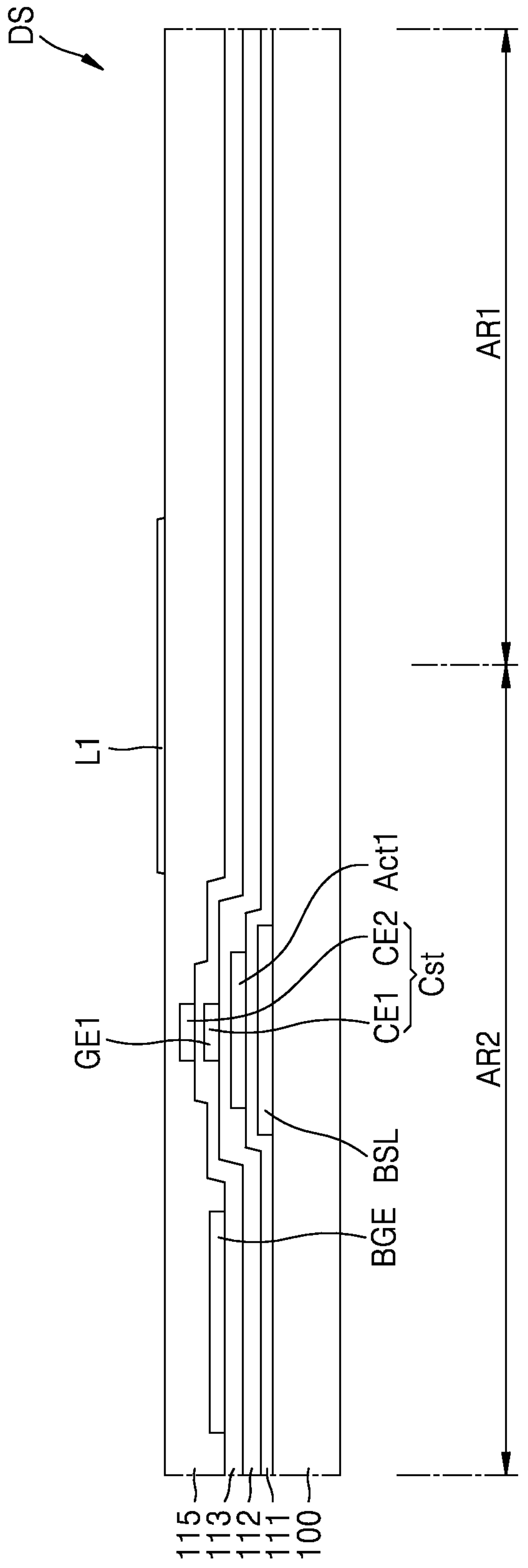
Figure 10D:
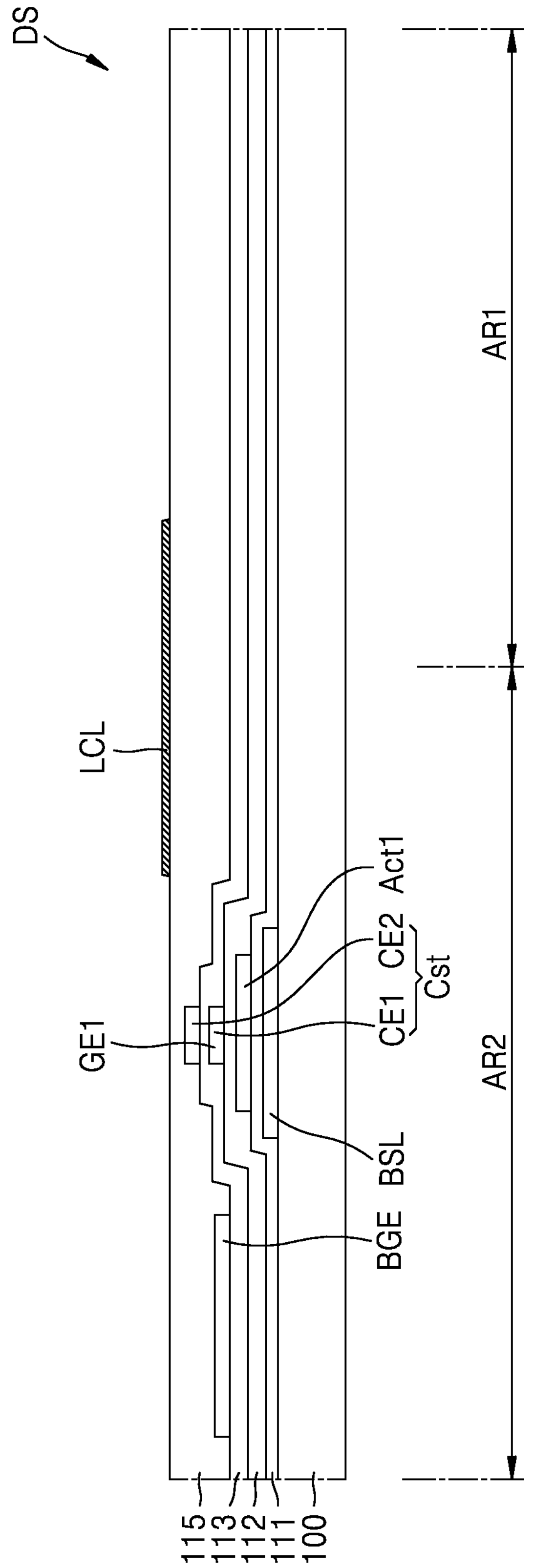

Referring to FIGS. 10B to 10D, a lower conductive layer LCL may be provided on the first inorganic insulating layer 115.

Referring to FIG. 10B, a first layer L1 including a conductive material may be provided on the first inorganic insulating layer 115. In an embodiment, the first layer L1 may be provided on an entire first inorganic insulating layer 115. In an embodiment, the first layer L1 may be formed using a sputtering method. The conductive material may include a transparent conductive material. In an embodiment, the conductive material may include a TCO. For example, the conductive material may include a conductive oxide, such as ITO, IZO, ZnO, $In_2O_3$, IGO, or AZO.

Referring to FIGS. 10C and 10D, the first layer L1 may be patterned. In an embodiment, a first photoresist pattern may be formed on the first layer L1, and the first layer L1 may be wet-etched. Then, the first photoresist pattern may be removed in a developing process.

Then, the first layer L1 may be cured. Thus, the first layer L1 may be crystallized, thereby forming the lower conductive layer LCL.

Figure 10E:
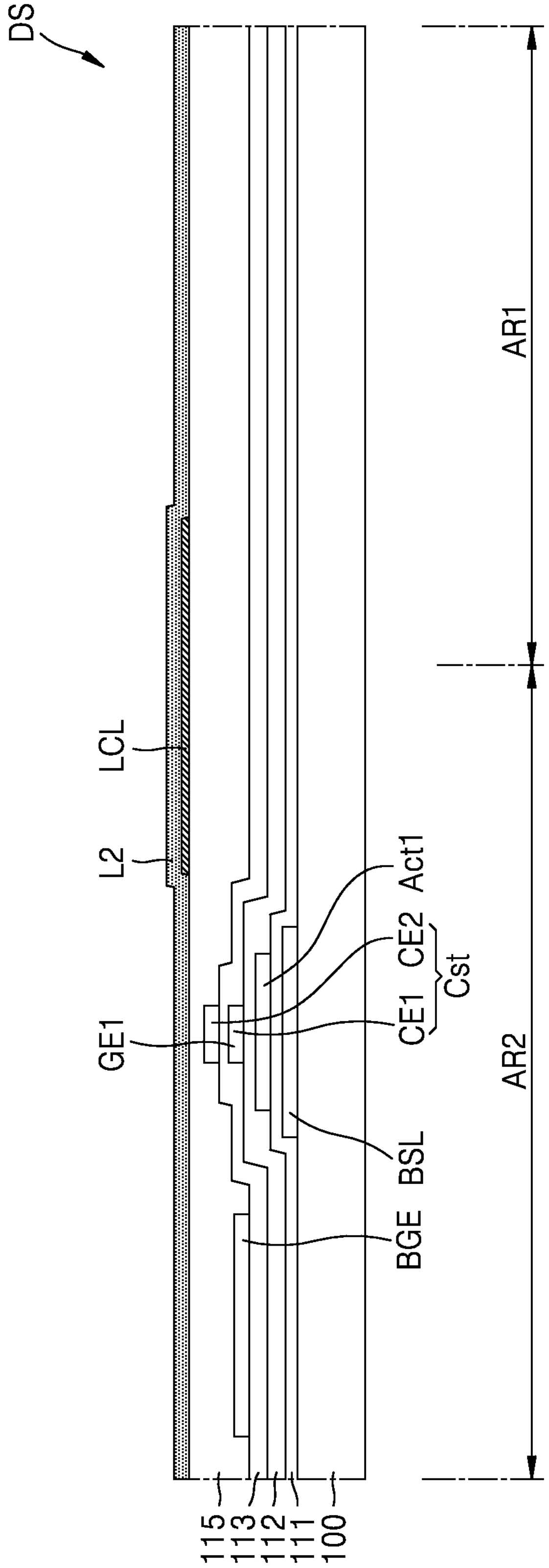
Figure 10F:
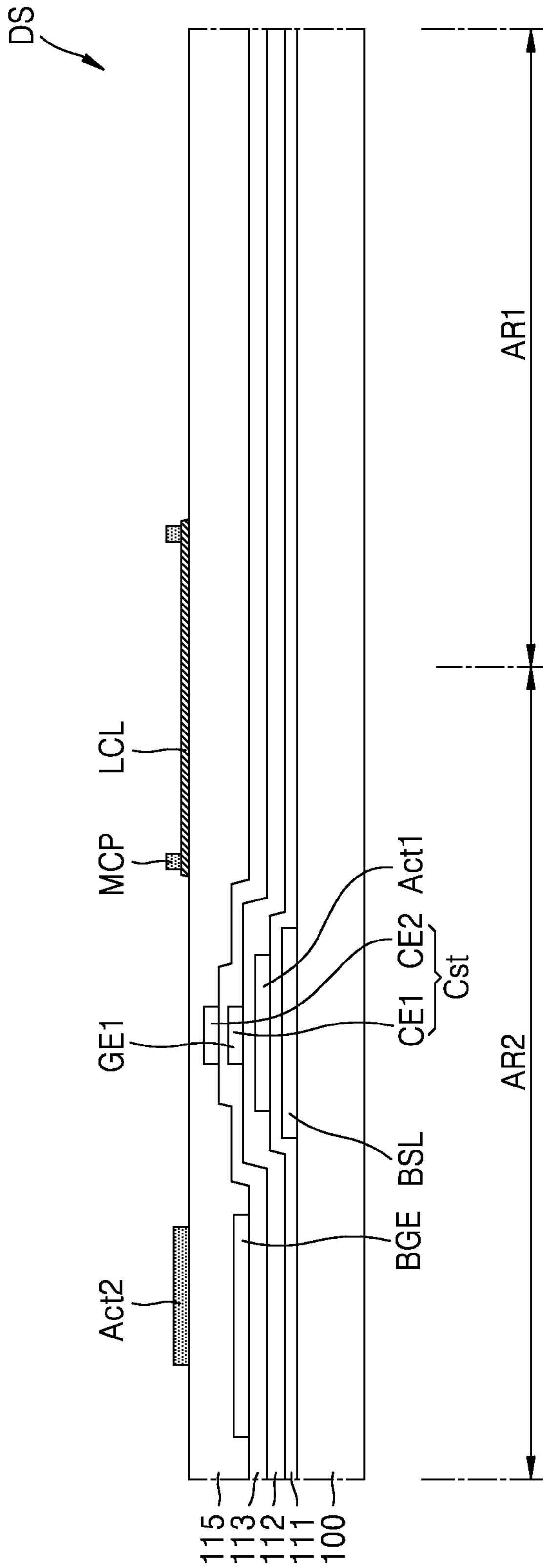

Referring to FIGS. 10E and 10F, a second semiconductor layer Act2 may be provided on the first inorganic insulating layer 115, and an intermediate conductive pattern MCP may be provided on the lower conductive layer LCL.

First, a second layer L2 including an oxide semiconductor may be provided on the first inorganic insulating layer 115 and the lower conductive layer LCL. The second layer L2 may be provided on the entire first inorganic insulating layer 115 and the entire lower conductive layer LCL. The second layer L2 may be directly connected onto the lower conductive layer LCL. In some embodiments, the second layer L2 may be formed directly on the lower conductive layer LCL. For example, the second layer L2 may include a Zn oxide-based material, such as a Zn oxide, an In—Zn oxide, a Ga—In—Zn oxide, or the like. In some embodiments, the second layer L2 may include an IGZO semiconductor, an ITZO semiconductor, or an IGTZO semiconductor, which contain In, Ga, or Sn in ZnO, respectively.

Then, the second layer L2 may be patterned. In an embodiment, the second semiconductor layer Act2 and the intermediate conductive pattern MCP may be formed simultaneously. In an embodiment, a second photoresist pattern may be formed on the second layer L2, and the second layer L2 may be wet-etched. Then, the second photoresist pattern may be removed in a developing process. Thus, the second semiconductor layer Act2 and the intermediate conductive pattern MCP may include the same material.

The lower conductive layer LCL may be crystallized by being cured after wet etching. Thus, even when the second layer L2 is wet-etched, the lower conductive layer LCL may not be etched or damaged due to selectivity. Thus, the formation of an additional insulating layer between the lower conductive layer LCL and the second layer L2 may not be necessary, and the number of masks used for manufacturing the display device may be reduced.

Figure 10G:
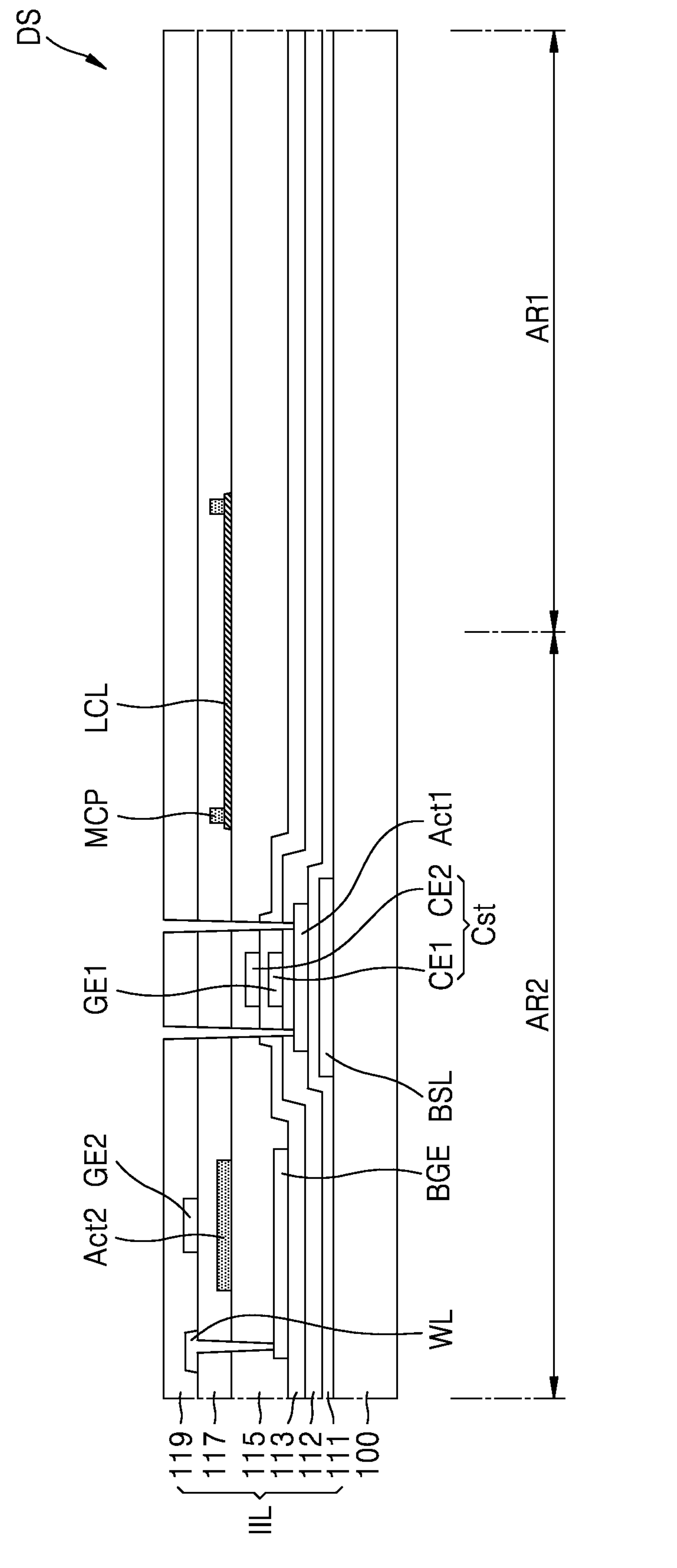

Referring to FIG. 10G, a second inorganic insulating layer 117 may be provided on a second semiconductor layer Act2 and an intermediate conductive pattern MCP. In an embodiment, a line WL and a second gate electrode GE2 may be provided on the second inorganic insulating layer 117. The second gate electrode GE2 may overlap the second semiconductor layer Act2.

Then, an interlayer insulating layer 119 may be formed. The interlayer insulating layer 119 may cover the line WL and the second gate electrode GE2, and may be provided on the second inorganic insulating layer 117.

In an embodiment, a contact hole through which a first semiconductor layer Act1 is exposed may be provided. In an embodiment, the first semiconductor layer Act1 may be exposed through a contact hole provided in a first gate insulating layer 112, a second gate insulating layer 113, a first inorganic insulating layer 115, the second inorganic insulating layer 117, and the interlayer insulating layer 119.

Figure 10H:
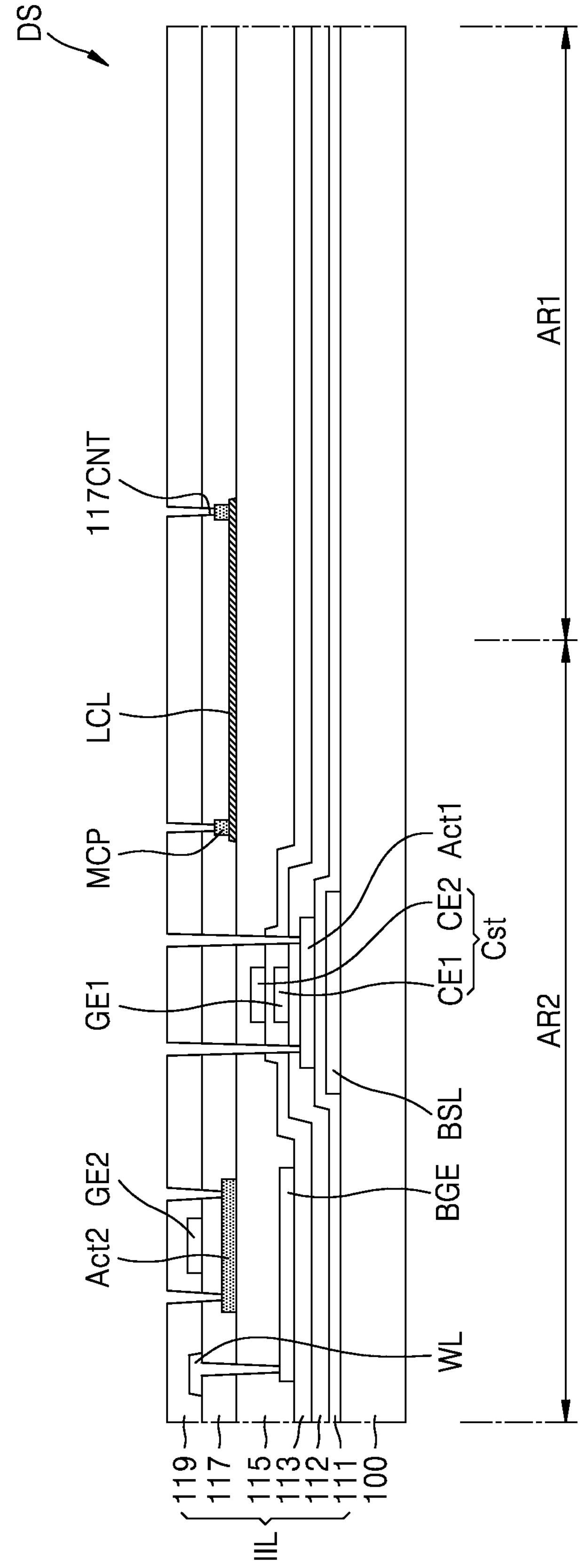

Referring to FIG. 10H, a contact hole 117CNT exposing the intermediate conductive pattern MCP may be provided in the second inorganic insulating layer 117. In an embodiment, the intermediate conductive pattern MCP may be exposed through the contact hole 117CNT in the second inorganic insulating layer 117 and the interlayer insulating layer 119. In the present embodiment, the intermediate conductive pattern MCP overlaps the contact hole 117CNT in the second inorganic insulating layer 117, and thus, damage to the lower conductive layer LCL may be prevented or reduced.

In an embodiment, a contact hole through which the second semiconductor layer Act2 is exposed may be provided in the second inorganic insulating layer 117 and the interlayer insulating layer 119. In an embodiment, the second semiconductor layer Act2 may be exposed through the contact hole in the second inorganic insulating layer 117 and the interlayer insulating layer 119. In an embodiment, the contact hole exposing the second semiconductor layer Act2 and a contact hole exposing the intermediate conductive pattern MCP may be formed simultaneously.

Figure 10I:
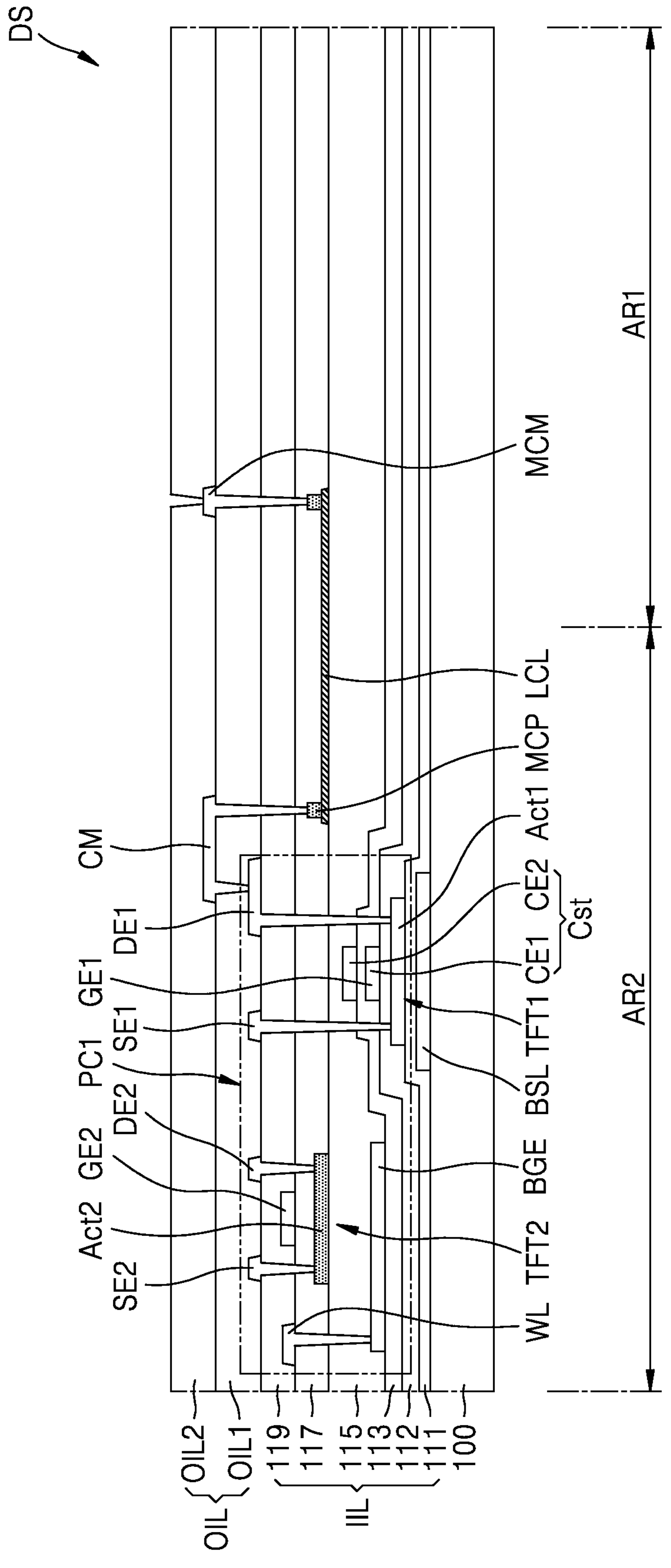

Referring to FIG. 10I, a first source electrode SE1, a first drain electrode DE1, a second source electrode SE2, and a second drain electrode DE2 may be provided. The first source electrode SE1 and the first drain electrode DE1 may be electrically connected to the first semiconductor layer Act1. The second source electrode SE2 and the second drain electrode DE2 may be electrically connected to the second semiconductor layer Act2.

Then, an organic insulating layer OIL may be formed. The organic insulating layer OIL may be provided on the first source electrode SE1, the first drain electrode DE1, the second source electrode SE2, and the second drain electrode DE2. In an embodiment, the organic insulating layer OIL may be provided on the second semiconductor layer Act2 and the intermediate conductive pattern MCP. The organic insulating layer OIL may include a first organic insulating layer OIL1 and a second organic insulating layer OIL2.

In an embodiment, the first organic insulating layer OIL1 may be provided on the interlayer insulating layer 119. The first organic insulating layer OIL1 may be provided on the first source electrode SE1, the first drain electrode DE1, the second source electrode SE2, and the second drain electrode DE2.

Then, the connection electrode CM and an intermediate connection electrode MCM may be provided on the first organic insulating layer OIL1. A connection electrode CM may be electrically connected to a first pixel circuit PC1. In an embodiment, the connection electrode CM may be electrically connected to the first source electrode SE1 or the first drain electrode DE1.

The connection electrode CM may be electrically connected to the lower conductive layer LCL. In an embodiment, the connection electrode CM may be electrically connected to the lower conductive layer LCL through the intermediate conductive pattern MCP. The connection electrode CM may be electrically connected to the lower conductive layer LCL through the contact hole in the second inorganic insulating layer 117, the interlayer insulating layer 119 and the first organic insulating layer OIL1.

The intermediate connection electrode MCM may be electrically connected to the lower conductive layer LCL. In an embodiment, the intermediate connection electrode MCM may be electrically connected to the lower conductive layer LCL through the intermediate conductive pattern MCP. The intermediate connection electrode MCM may be electrically connected to the lower conductive layer LCL through the contact hole 117CNT in the second inorganic insulating layer 117, the interlayer insulating layer 119 and the first organic insulating layer OIL1.

Then, the second organic insulating layer OIL2 may be formed. The second organic insulating layer OIL2 may cover the connection electrode CM and the intermediate connection electrode MCM. In an embodiment, the second organic insulating layer OIL2 may include a contact hole that exposes the intermediate connection electrode MCM or the connection electrode CM.

Figure 10J:
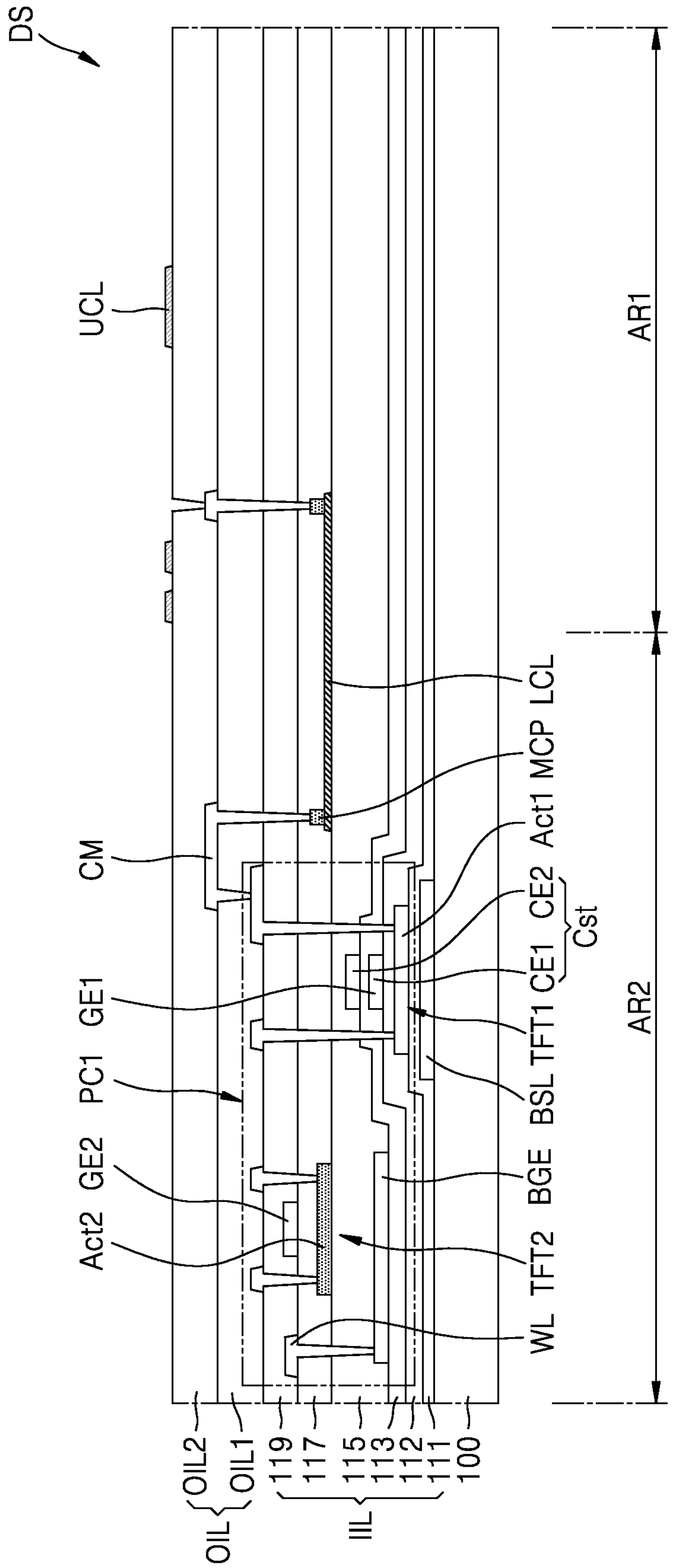

Referring to FIG. 10J, an upper conductive layer UCL may be provided on the organic insulating layer OIL. In an embodiment, the upper conductive layer UCL and the lower conductive layer LCL may at least partially overlap each other.

The upper conductive layer UCL may be formed to be similar to the lower conductive layer LCL. In an embodiment, a third layer including a conductive material may be provided on the organic insulating layer OIL. The third layer may be formed using a sputtering method. The conductive material may include a transparent conductive material. In an embodiment, the conductive material may include a TCO. For example, the conductive material may include a conductive oxide, such as ITO, IZO, ZnO, $In_2O_3$, IGO, or AZO.

Then, the third layer may be patterned. In an embodiment, a third photoresist pattern may be formed on the third layer, and the third layer may be wet-etched. Then, the third photoresist pattern may be removed during a developing process.

Then, the third layer may be cured. Thus, the third layer is crystallized, thereby forming the upper conductive layer UCL.

Figure 10K:
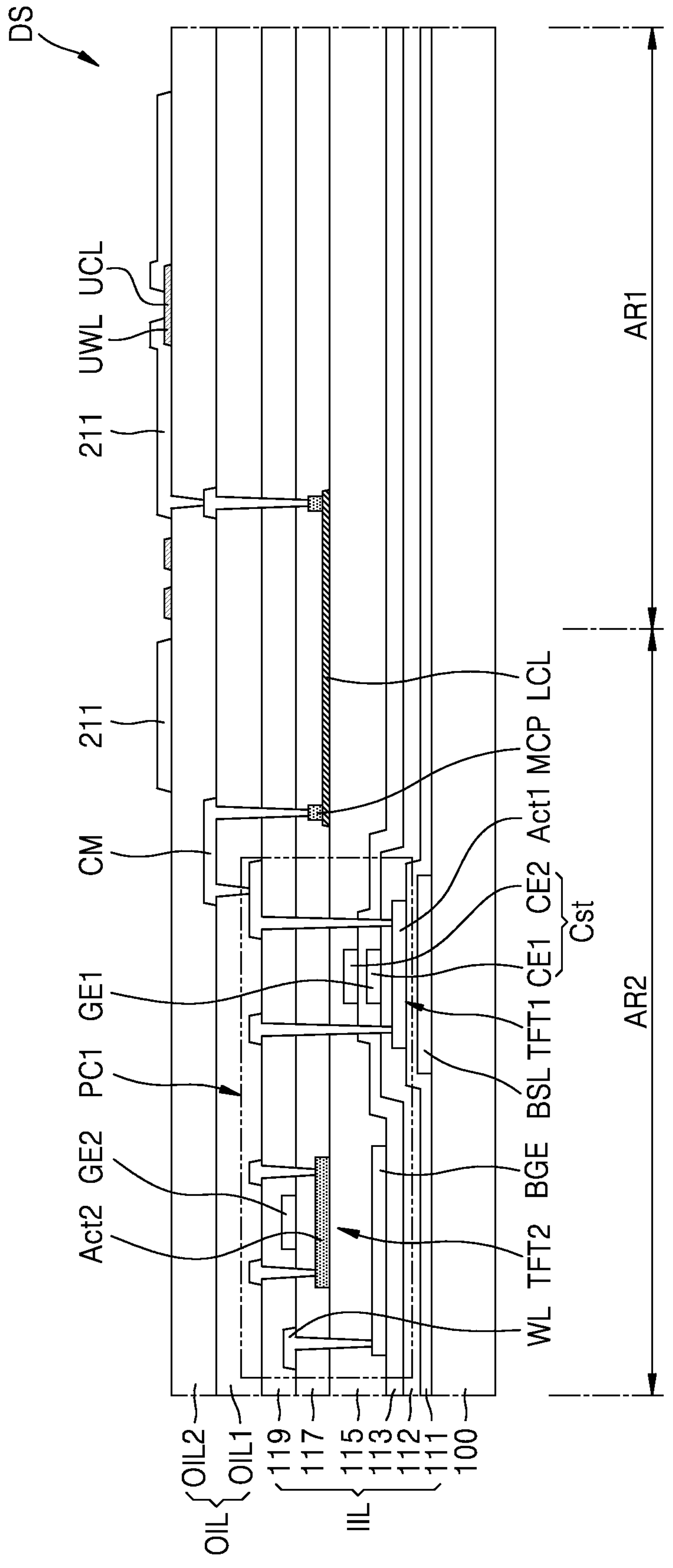

Referring to FIG. 10K, the pixel electrode 211 at least partially covering the upper conductive layer UCL may be provided. In an embodiment, a pixel electrode 211 may be formed after the upper conductive layer UCL is formed. In an embodiment, a plurality of pixel electrodes 211 may be provided.

In an embodiment, the pixel electrode 211 may be arranged in one of the first area AR1 and the second area AR2. For example, the pixel electrode 211 may be arranged in the first area AR1. In another example, the pixel electrode 211 may be arranged in the second area AR2. In another example, the plurality of pixel electrodes 211 may be arranged in the first area AR1 and the second area AR2.

In an embodiment, a fourth layer covering the organic insulating layer OIL and the upper conductive layer UCL may be provided. The fourth layer may include a conductive oxide, such as ITO, IZO, ZnO, $In_2O_3$, IGO, or AZO. In another embodiment, the fourth layer may include a reflective layer including Ag, Mg, Al, Pt, Pd, Au, Ni, Nd, Ir, Cr, or any compounds thereof. In another embodiment, the fourth layer may further include a layer including ITO, IZO, ZnO, or $In_2O_3$, on or below the reflective layer.

Then, the fourth layer may be patterned, and the plurality of pixel electrodes 211 may be formed. The upper conductive layer UCL may electrically connect one of the plurality of pixel electrodes 211 and the other one of the plurality of pixel electrodes 211 to each other. In an embodiment, the one of the plurality of pixel electrodes 211 may at least partially cover one side of the upper conductive layer UCL. The other one of the plurality of pixel electrodes 211 may at least partially cover the other side of the upper conductive layer UCL. In other words, the upper conductive layer UCL may include an upper line UWL that electrically connects the one of the plurality of pixel electrodes 211 and the other one of the plurality of pixel electrodes 211 to each other.

In an embodiment, the plurality of pixel electrodes 211 may be formed simultaneously. In an embodiment, a fourth photoresist pattern may be provided on the fourth layer and the fourth layer may be wet-etched. Then, the fourth photoresist pattern may be removed during a developing process.

The upper conductive layer UCL may be crystallized by being cured after wet etching. Thus, even when the fourth layer is wet-etched, the upper conductive layer UCL may not be etched or damaged due to selectivity. Thus, the formation of an additional insulating layer between the upper conductive layer UCL and the fourth layer may not be necessary, and the number of masks used for manufacturing the display device may be reduced.

Figure 10L:
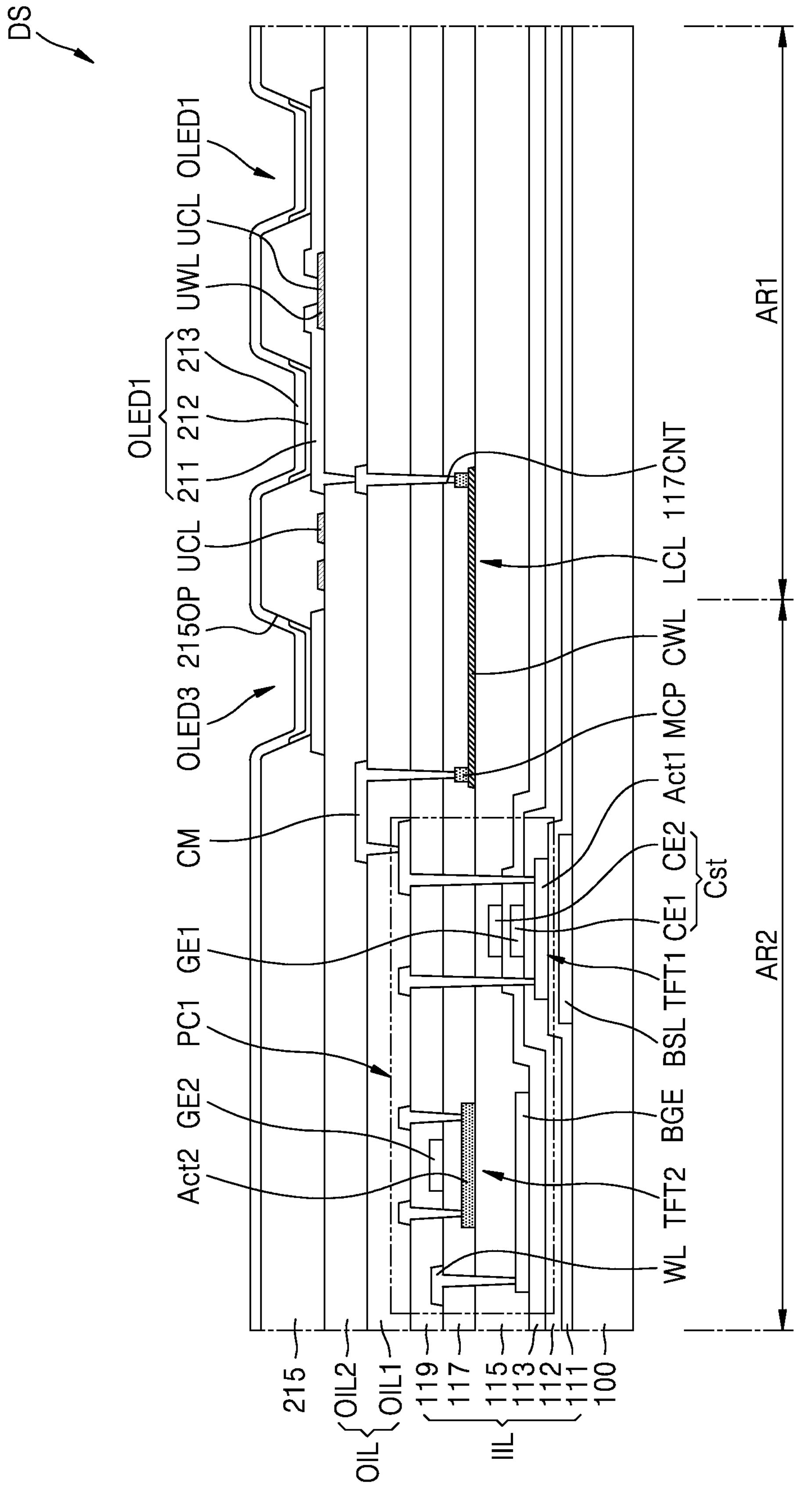

Referring to FIG. 10L, a pixel-defining layer 215 covering the pixel electrode 211 and the upper conductive layer UCL may be provided, the pixel-defining layer 215 including an opening 2150P overlapping the pixel electrode 211. In an embodiment, the upper conductive layer UCL may be arranged between the organic insulating layer OIL and the pixel-defining layer 215. In an embodiment, the pixel-defining layer 215 may include the plurality of openings 2150P, which may overlap the plurality of pixel electrodes 211, respectively.

Then, an intermediate layer 212 may be formed. In an embodiment, the intermediate layer 212 may be formed using a vapor deposition method. In an embodiment, the intermediate layer 212 may be formed using at least one of screen printing, inkjet printing, and laser thermal imaging. In the present embodiment, the upper conductive layer UCL is arranged below the pixel electrode 211, and thus, a short circuit between the intermediate layer 212 and the upper conductive layer UCL may be prevented or reduced.

Then, an opposite electrode 213 may be formed. In an embodiment, the opposite electrode 213 may be provided on the entire substrate 100. The pixel electrode 211, the intermediate layer 212, and the opposite electrode 213 may constitute an organic light-emitting diode. For example, the pixel electrode 211, the intermediate layer 212, and the opposite electrode 213 may constitute a first organic light-emitting diode OLED1 or a third organic light-emitting diode OLED3. In an embodiment, one of the plurality of first organic light-emitting diodes OLED1 and the other one of the plurality of first organic light-emitting diodes OLED1 may be electrically connected to each other.

In an embodiment, at least one of the lower conductive layer LCL and the upper conductive layer UCL may include a connection line CWL extending to the second area AR2 from the first area AR1. For example, the lower conductive layer LCL may include the connection line CWL extending to the second area AR2 from the first area AR1. In another embodiment, the upper conductive layer UCL may include the connection line CWL extending to the second area AR2 from the first area AR1. In another example, each of the lower conductive layer LCL and the upper conductive layer UCL may include the connection line CWL extending to the second area AR2 from the first area AR1. In this case, the first pixel circuit PC1 arranged in the second area AR2 and the first organic light-emitting diode OLED1 arranged in the first area AR1 may be electrically connected to each other. Thus, a manufactured display panel or the display panel DS may maintain high light transmittance in the first area AR1, and may display an image.

In the present embodiment, one of the plurality of first organic light-emitting diodes OLED1 and the other one of the plurality of first organic light-emitting diodes OLED1 may be electrically connected to each other. For example, the one of the plurality of first organic light-emitting diodes OLED1 and the other one of the plurality of first organic light-emitting diodes OLED1 may be electrically connected to each other through the upper line UWL or the lower line. Thus, a plurality of organic light-emitting diodes as a plurality of display elements may emit light using a small number of pixel circuits.

As described above, in the display device according to an embodiment of the present disclosure, a lower conductive layer and an upper conductive layer are spaced apart from each other with an organic insulating layer interposed therebetween, thus preventing interference between the lower conductive layer and the upper conductive layer, and increasing the number of first display elements and the number of second display elements. Accordingly, a resolution may be increased. In addition, the number of pixel circuits in the display device may be reduced, and thus, high transmittance may be maintained.

In a method of manufacturing the display device according to an embodiment of the present disclosure, a second semiconductor layer is provided on a first inorganic insulating layer, and an intermediate conductive pattern is provided on a lower conductive layer. Thus, the manufacturing process may be simplified. In addition, the intermediate conductive pattern may prevent or reduce damage to the lower conductive layer, and may improve the reliability of a manufactured display device.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:

a substrate;

an organic insulating layer arranged on the substrate;

a plurality of display elements arranged on the organic insulating layer and comprising a plurality of first display elements and a plurality of second display elements, the plurality of display elements comprising a plurality of pixel electrodes;

a plurality of emission layers disposed on each of the plurality of pixel electrodes;

an opposite electrode disposed on the plurality of emission layers;

a lower line arranged between the substrate and the organic insulating layer, and electrically connecting the pixel electrode of one of the plurality of first display elements to the pixel electrode of another one of the plurality of first display elements, each of the plurality of first display elements emitting light of the same color;

an upper line arranged on the organic insulating layer, and electrically connecting one of the plurality of second display elements and another one of the plurality of second display elements to each other; and a pixel defining layer covering the upper line, the pixel defining layer including a plurality of openings overlapping the plurality of pixel electrodes, wherein an entire portion of the upper line is disposed on a same layer as the plurality of pixel electrodes, and the opposite electrode is disposed on the pixel defining layer.

2. The display device of claim 1, wherein the lower line and the upper line cross each other in a plan view.

3. The display device of claim 1, further comprising:

a first thin-film transistor arranged on the substrate, and comprising a first semiconductor layer and a first gate electrode overlapping the first semiconductor layer, the first semiconductor layer including a silicon semiconductor;

a first inorganic insulating layer covering the first gate electrode;

a second thin-film transistor arranged on the first inorganic insulating layer, and comprising a second semiconductor layer and a second gate electrode overlapping the second semiconductor layer, the second semiconductor layer including an oxide semiconductor; and a second inorganic insulating layer arranged between the second semiconductor layer and the second gate electrode, wherein the lower line is arranged between the first inorganic insulating layer and the second inorganic insulating layer.

4. The display device of claim 3, further comprising an intermediate conductive pattern arranged between the lower line and the second inorganic insulating layer, wherein the second inorganic insulating layer includes a contact hole overlapping the intermediate conductive pattern.

5. The display device of claim 4, wherein the intermediate conductive pattern and the second semiconductor layer include a same material.

6. The display device of claim 1, wherein one of the plurality of pixel electrodes at least partially covers one side of the upper line, and another one of the plurality of pixel electrodes at least partially covers another side of the upper line.

7. The display device of claim 1, wherein the plurality of display elements comprises a first sub-pixel, a second sub-pixel, and a third sub-pixel which emit light of different wavelengths from each other, wherein the second sub-pixel is arranged at a center of a virtual quadrilateral, wherein the first sub-pixel and the third sub-pixel are arranged at vertices of the virtual quadrilateral, respectively, and wherein the one of the plurality of first display elements and the another one of the plurality of first display elements correspond to one of the first sub-pixel, the second sub-pixel, and the third sub-pixel, respectively.

8. The display device of claim 1, further comprising a pixel circuit electrically connected to the plurality of display elements, wherein the substrate comprises a first area and a second area arranged adjacent to the first area, wherein the plurality of display elements is arranged in the first area and the second area, and wherein the pixel circuit is arranged in the second area.

9. The display device of claim 8, further comprising a connection line arranged on a same layer as one of the lower line and the upper line, wherein the plurality of first display elements and the plurality of second display elements are arranged in the first area, and wherein the connection line comprises a transparent conductive material and extends to the second area from the first area.

10. The display device of claim 8, further comprising a component overlapping the first area.

11. A display device comprising:

a substrate;

an organic insulating layer arranged on the substrate;

a plurality of display elements arranged on the organic insulating layer and comprising a plurality of first display elements and a plurality of second display elements, the plurality of display elements comprising a plurality of pixel electrodes;

a plurality of emission layers disposed on each of the plurality of pixel electrodes;

an opposite electrode disposed on the plurality of emission layers;

a lower line arranged between the substrate and the organic insulating layer, and electrically connecting the pixel electrode of one of the plurality of first display elements to the pixel electrode of another one of the plurality of first display elements, each of the plurality of first display elements emitting light of the same color; and an upper line arranged on the organic insulating layer and under the opposite electrode, and electrically connecting the pixel electrode of one of the plurality of second display elements and the pixel electrode of another one of the plurality of second display elements to each other.

12. A display device comprising:

a substrate;

an organic insulating layer arranged on the substrate;

a plurality of display elements arranged on the organic insulating layer and comprising a plurality of first display elements and a plurality of second display elements, the plurality of display elements comprising a plurality of pixel electrodes;

a plurality of emission layers disposed on each of the plurality of pixel electrodes;

an opposite electrode disposed on the plurality of emission layers;

a lower line arranged between the substrate and the organic insulating layer, and electrically connecting the pixel electrode of one of the plurality of first display elements to the pixel electrode of another one of the plurality of first display elements;

an upper line arranged on the organic insulating layer and under the opposite electrode, and electrically connecting one of the plurality of second display elements and another one of the plurality of second display elements to each other, wherein the lower line and the upper line are disposed on different layers from each other.

* * * * *